United States Patent
Yanagida et al.

(10) Patent No.: US 8,124,241 B2
(45) Date of Patent: Feb. 28, 2012

(54) PROCESS FOR PRODUCING MULTILAYER POLYMIDE FILM

(75) Inventors: Masami Yanagida, Otsu (JP); Kenji Ueshima, Kobe (JP); Yuzuru Saito, Settsu (JP)

(73) Assignee: Kaneka Corporation, Osaka (JP)

( * ) Notice: Subject to any disclaimer, the term of this patent is extended or adjusted under 35 U.S.C. 154(b) by 772 days.

(21) Appl. No.: 12/224,533

(22) PCT Filed: Feb. 19, 2007

(86) PCT No.: PCT/JP2007/052950
§ 371 (c)(1),
(2), (4) Date: Aug. 27, 2008

(87) PCT Pub. No.: WO2007/099801
PCT Pub. Date: Sep. 7, 2007

(65) Prior Publication Data
US 2009/0104465 A1  Apr. 23, 2009

(30) Foreign Application Priority Data

Mar. 1, 2006 (JP) ................. 2006-055262
Mar. 14, 2006 (JP) ................. 2006-068732
Mar. 16, 2006 (JP) ................. 2006-072134

(51) Int. Cl.
*B32B 27/00* (2006.01)
*B29C 47/00* (2006.01)

(52) U.S. Cl. ............ 428/473.5; 264/173.11; 264/173.16
(58) Field of Classification Search ............ 264/173.11, 264/173.16; 428/473.5
See application file for complete search history.

(56) References Cited

U.S. PATENT DOCUMENTS

| | | | |
|---|---|---|---|
| 3,940,221 A | 2/1976 | Nissel | 425/141 |
| 6,251,507 B1* | 6/2001 | Yamamoto et al. | 428/215 |
| 2007/0158869 A1 | 7/2007 | Yanagida et al. | 264/173.12 |

FOREIGN PATENT DOCUMENTS

| | | |
|---|---|---|
| CA | 1060172 | 8/1979 |
| JP | 60-206615 | 10/1985 |
| JP | 11-309770 | 11/1999 |
| JP | 2001-071418 | 3/2001 |
| JP | 2001-129838 | 5/2001 |
| JP | 2005-305968 | 11/2005 |
| WO | 2005 111165 | 11/2005 |

OTHER PUBLICATIONS

International Search Report mailed Apr. 24, 2007 (1 pg).
English translation of PCT International Preliminary Report on Patentability issued Sep. 12, 2008 (6 pgs).

* cited by examiner

*Primary Examiner* — Dhirajlal S Nakarani
(74) *Attorney, Agent, or Firm* — Kagan Binder, PLLC

(57) ABSTRACT

It is an object of the present invention to provide a method for manufacturing a multilayer polyimide film, uniform in film thickness and rate of dimensional change in the width direction of the film, which has a thermoplastic polyimide layer or the like serving as an adhesive layer. The object is attained by a method for manufacturing a multilayer polyimide film by width-spreading and flow-casting at least two types of polyimide resin solutions or polyimide precursor resin solutions fed into a multilayer coextrusion die including a plurality of flow channels, the method being characterized in that the thickness of each layer of the multilayer film is controlled by adding a solvent to the resin solutions to be fed into at least one of the flow channels and by adjusting, independently of the amounts of the resin solutions to be fed, the amount of the solvent to be added.

13 Claims, 5 Drawing Sheets

PROCESS FOR PRODUCING MULTILAYER POLYIMIDE FILM

PRIORITY

The present patent Application claims benefit from International application PCT/JP2007/052950, having a PCT publication number of WO 2007/099801 A1, which was filed on Feb. 19, 2007, which in turn claims priority from Japan patent application number 2006-055262, which was filed on Mar. 1, 2006; Japan patent application number 2006-068732, which was filed on Mar. 14, 2006; and Japan patent application number 2006-072134, which was filed on Mar. 16, 2006.

TECHNICAL FIELD

The present invention relates to methods for manufacturing multilayer polyimide films. In particular, the present invention relates to a method for manufacturing a multilayer polyimide film uniform in thickness of each layer.

BACKGROUND ART

In recent years, as electronic products have had lighter weights and smaller sizes, there has been an increasing demand for various printed-circuit boards. Among the printed-circuit boards, flexible printed-circuit boards (FPCs) have been increasingly demanded in particular. A flexible printed-circuit board is produced from a flexible laminate obtained by laminating metal foil such as copper foil on an insulating film.

Such a flexible laminate is manufactured by a method for laminating metal foil onto a surface of a flexible insulating film by heating and pressure bonding via an adhesive. Preferred examples of the flexible insulating film include a polyimide film. Commonly-used examples of the adhesive include thermosetting adhesives such as epoxy adhesives and acrylic adhesives. Such a flexible printed-circuit board manufactured with use of a thermosetting adhesive is called "three-layer FPC" because of its three-layer structure of a substrate, an adhesive, and metal foil.

It should be noted that a polyimide film is usually manufactured by a flow-casting film-forming method by which: a polyamic acid solution serving as a precursor is extruded with use of an extrusion die onto a casting belt in the form of a film; a self-supporting film is obtained by evaporating a solvent; and the self-supporting film is dried by heating.

A thermosetting adhesive for use in a three-layer FPC offers an advantage of enabling adhesion at a relatively low temperature. However, a three-layer FPC manufactured with use of a thermosetting adhesive is limited in properties such as heat resistance, bendability, and electric reliability. Proposed in view of this is an FPC obtained by forming a metal layer directly on a polyimide film without using a thermosetting adhesive. Such an FPC excels in heat resistance, bendability, electric reliability, and other properties. Such an FPC is called "two-layer FPC" because it is obtained by forming a metal layer directly on a polyimide film.

Known examples of a method for manufacturing a laminate for use in a two-layer FPC include (a) a casting method for imidizing polyamic acid, serving as a polyimide precursor, which has been flow-cast and applied onto metal foil; (b) a metalizing method for forming a metal layer directly on a polyimide film by sputtering and plating; and (c) a laminating method for laminating a polyimide film and metal foil with a thermoplastic polyimide sandwiched therebetween. Among these methods, the laminating method can deal with a wider range of thickness of metal foil than the casting method, and is lower in apparatus cost than the metalizing method.

Usually, the laminating method employs an adhesive polyimide film obtained by forming a thermoplastic polyimide layer(s) on one surface or both surfaces of a highly heat-resistant polyimide film.

There are various methods devised as a method for manufacturing such an adhesive polyimide film. Highly productive among these methods is an extrusion casting method by which after a highly heat-resistant polyimide resin solution or a precursor solution thereof and a thermoplastic polyimide solution or a precursor solution thereof are extruded with use of a multilayer coextrusion die onto a casting belt so as to form a multilayer liquid film, the multilayer liquid film is dried by heating.

It is necessary for a polyimide film to be entirely uniform in thickness. Furthermore, it is necessary for a multilayer polyimide film not only to be uniform in total thickness, but also to be uniform in thickness of each layer. In a multilayer polyimide film that is uniform in total thickness but is not uniform in thickness of each layer, the layers have different coefficients of linear expansion; therefore, the multilayer polyimide film suffers from the nonuniformity of coefficient of linear expansion across the whole film.

Further, a polyimide film that is not uniform in total thickness or thickness of each layer has a partially noncontact portion or a dimensionally changeable portion undesirably generated when metal foil such as copper foil is laminated on the polyimide film.

The extrusion casting method makes it easy to obtain a film uniform in total thickness or thickness of each layer in the length direction (MD direction). However, the extrusion casting method does not make it easy to obtain a film uniform in total thickness or thickness of each layer in the width direction (TD direction).

Each of Patent Documents 1 and 2 discloses a method for, in molding a thermoplastic resin by extrusion, adjusting the thickness of a sheet or a film to be formed. Patent Document 1 discloses a method for adjusting the space between lips of an extrusion die by attaching, to the lips, heat bolts, i.e., bolts that expand with heat. Patent Document 2 discloses a method for adjusting the thickness of a sheet or a film by adjusting the discharge rate of a molten resin by changing the temperature of lips of an extrusion die by attaching lip heaters, i.e., heating means to the vicinity of the lips.

Patent Document 3 discloses a method for, in order to adjust the thickness of a sheet or a film in the width direction, attaching a plurality of heat bolts or lip heaters to lips so that the heat bolts or lip heaters are placed in the width direction (usually at intervals of 7 mm to 40 mm). The method makes it possible to directly control a thickness distribution. However, the method suffers from the disadvantage of being complex in apparatus and highly complex in control program. Furthermore, in the case of manufacture of an adhesive polyimide film with use of a multilayer coextrusion die for the purpose of manufacturing a multilayer film, the method makes it possible to control a distribution of total film thickness, but impossible to control a distribution of thickness of each layer.

Patent Document 4 discloses a technique for, in a feed-block multilayer coextrusion die, uniforming a distribution of film thickness in the width direction by uniforming the flow rate of each molten resin by heating each molten resin separately in a flow channel provided in the feed block. However, the method makes it necessary to adjust the temperatures of resins in a large number of flow channels provided in a narrow space inside of the feed block. Furthermore, the method of Patent Document 4 makes it difficult to measure viscosity, and therefore makes it also difficult to perform feedback control.

As described above, there is a known method for controlling the thickness of a multilayer thermoplastic resin film. However, there is no known method for controlling the thickness of a multilayer polyimide film manufactured with use of a solution. It is difficult to apply, to the manufacture of a multilayer polyimide film, the method for controlling the thickness of a multilayer thermoplastic resin film. Further, there is no known multilayer polyimide film, manufactured with use of a multilayer coextrusion die, which is uniform in thickness of each layer.

Patent Document 1: U.S. Pat. No. 3,940,221 Specification
Patent Document 2: Japanese Examined Patent Application Publication No. 59050/1982 (Tokukosho 57-59050)
Patent Document 3: Japanese Unexamined Patent Application Publication No. 206615/1985 (Tokukaisho 60-206615)
Patent Document 4: Japanese Unexamined Patent Application Publication No. 309770/1999 (Tokukaihei 11-309770)

DISCLOSURE OF THE INVENTION

Problems to be Solved by the Invention

It is an object of the present invention to provide: a method for manufacturing, with use of a multilayer coextrusion die, a multilayer polyimide film uniform in thickness of each layer in the film-width direction; and a polyimide film to be so obtained.

Means to Solve the Problems

The inventors found that the foregoing object can be attained by adjusting the concentration of a resin by adding a solvent such as an organic solvent to a polyimide resin solution to be fed into a multilayer coextrusion die. That is, the present invention relates to the following method for manufacturing a multilayer polyimide film and the following multilayer polyimide film.

(1) A method for manufacturing a multilayer polyimide film in which a thickness of each layer is controlled, including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the method comprising the steps of: adding a solvent to the resin solutions to be fed into at least one of the flow channels; and adjusting, independently of amounts of the resin solutions to be fed, an amount of the solvent to be added.

The method makes it possible to control the component ratio of film thickness of each layer in the width direction without changing the average film thickness of each layer of a multilayer polyimide film to be obtained.

(2) The method as set forth in (1), wherein: the multilayer coextrusion die is a three-layer coextrusion die; and the solvent is added only to a resin solution to be fed into a flow channel corresponding to a central layer.

(3) The method as set forth in (1) or (2), further comprising the step of adding, to the resin solutions to be fed into at least one of the flow channels, a solution containing a chemical dehydrating agent and an imidization catalyst.

The method makes it possible to improve the rate of imidization reaction and the productivity of multilayer polyimide films.

(4) The method as set forth in (3), wherein: the multilayer coextrusion die is a three-layer coextrusion die; and the solution containing the chemical dehydrating agent and the imidization catalyst is added only to a resin solution to be fed into a flow channel corresponding to a central layer.

(5) The method as set forth in (3) or (4), further comprising the step of adjusting, independently of an amount of the solution, containing the chemical dehydrating agent and the imidization catalyst, to be added, the amount of the solvent to be added.

(6) The method as set forth in any one (1) to (5), wherein: one of the at least two types of polyimide resin solutions or polyimide precursor resin solutions is a highly heat-resistant polyimide solution or a precursor resin solution thereof; and the other one of the at least two types of polyimide resin solutions or polyimide precursor resin solutions is a thermoplastic polyimide solution or a precursor resin solution thereof.

(7) The method as set forth in (6), wherein: the multilayer coextrusion die is a three-layer coextrusion die; the highly heat-resistant polyimide solution or the precursor resin solution thereof is fed into a flow channel corresponding to a central layer; and the thermoplastic polyimide solution or the precursor resin solution thereof is fed into two remaining flow channels.

The method makes it possible to obtain an adhesive multilayer polyimide film, suitable for a two-layer FPC, to which copper foil can adhere directly.

(8) A multilayer polyimide film, having at least two types of polyimide layers, which is obtained by a manufacturing method including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the multilayer polyimide film having layers each of whose deviations in component ratio of film thickness in a film-width direction falls within a range of not less than −10% to not more than 10%.

(9) The multilayer polyimide film as set forth in (8), wherein the multilayer polyimide film is a multilayer film obtained by laminating, on at least one surface of a highly heat-resistant polyimide layer, an adhesive layer containing a thermoplastic polyimide.

(10) The multilayer polyimide film as set forth (8) or (9), wherein the deviation in component ratio of film thickness in the film-width direction falls within a range of not less than −5% to not more than 5%.

(11) A multilayer polyimide film, having at least two types of polyimide layers, which is obtained by a manufacturing method including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the multilayer polyimide film having a deviation of not less than −0.05% to not more than 0.05% in rate of dimensional change in a film-width direction.

(12) The multilayer polyimide film as set forth in (11), wherein the multilayer polyimide film is a multilayer film obtained by laminating, on at least one surface of a highly heat-resistant polyimide layer, an adhesive layer containing a thermoplastic polyimide.

(13) The multilayer polyimide film as set forth in (11) or (12), wherein the deviation in rate of dimensional change in the film-width direction falls within a range of not less than −0.03% to not more than 0.03%.

Effects of the Invention

The present invention makes it possible to simply manufacture a multilayer polyimide film uniform in component ratio of film thickness of each layer in the width direction of the film.

A multilayer polyimide film that can be obtained by a manufacturing method of the present invention is small in fluctuation in properties in the film-width direction. For this reason, the multilayer polyimide film can form a flexible laminate on which a semiconductor chip or the like can be mounted with a high degree of accuracy.

REFERENCE NUMERALS

Figure 1:
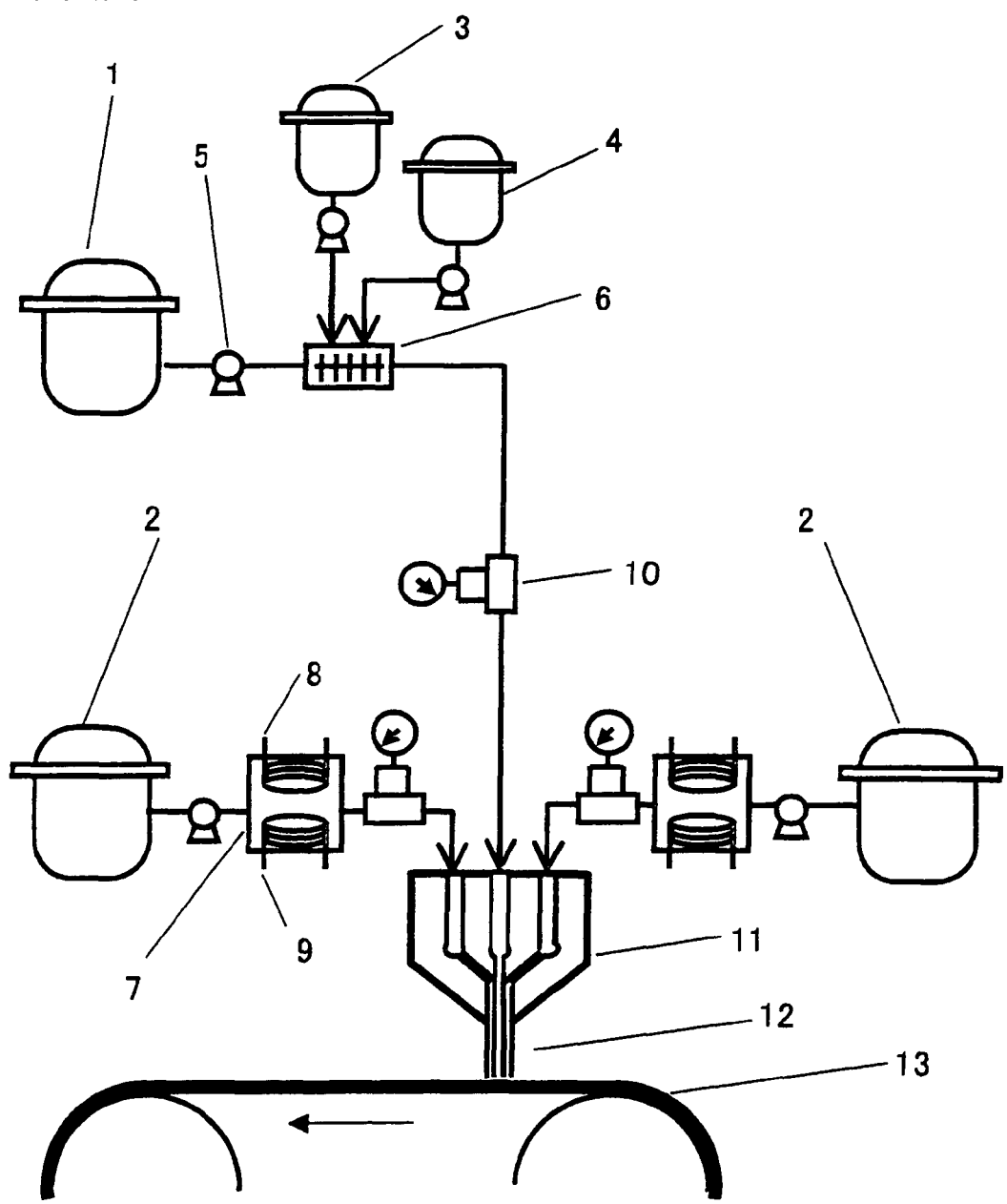
FIG. 1 shows an example of an apparatus of the present invention.

1 Storage tank for storing a highly heat-resistant polyimide resin solution
2 Storage tank for storing a thermoplastic polyimide resin solution
3 Storage tank for storing a solvent
4 Storage tank for storing a chemical curing agent.
5 Pump
6 Mixer
7 Temperature-control device
8 Heating device
9 Cooling device
10 Viscometer
11 Multilayer coextrusion die
12 Multilayer liquid film
13 Casting belt

BEST MODE FOR CARRYING OUT THE INVENTION

A multilayer polyimide film of the present invention has at least two types of polyimide layers. The at least two types of polyimide layers are preferably, but are not limited to, a highly heat-resistant polyimide layer and a thermoplastic polyimide layer capable of serving as an adhesive layer that adheres to metal foil. A multilayer film having a thermoplastic polyimide layer(s) on one surface or both surfaces of a highly heat-resistant polyimide layer can be laminated on copper foil or the like by thermocompression bonding, and makes it possible to manufacture a high-performance flexible laminate. Examples of such a multilayer polyimide film include: a two-layer polyimide film in which a highly heat-resistant polyimide layer and a thermoplastic polyimide layer are laminated; a three-layer polyimide film in which a thermoplastic polyimide layer, a highly heat-resistant polyimide layer, and a thermoplastic polyimide layer are laminated in the order named or in which a thermoplastic polyimide layer, a highly heat-resistant polyimide layer, and a highly heat-resistant polyimide layer are laminated in the order named; and a five-layer polyimide film in which a thermoplastic polyimide layer, a highly heat-resistant polyimide layer, a highly heat-resistant polyimide layer, a highly heat-resistant polyimide layer, and a thermoplastic polyimide layer are laminated in the order named. In the case of a multilayer polyimide film having three or more layers, thermoplastic polyimide layers or highly heat-resistant polyimide layers contained in a single adhesive film may be of identical resins or different resins.

FIG. 1 shows a typical example of an apparatus for use in the present invention. However, the present invention is not limited to this. In the following, a polyimide resin solution or a polyimide precursor resin solution will be referred to simply as "resin solution". Further, a solution obtained by dissolving a chemical dehydrating agent and an imidization catalyst in an organic solvent will be referred to as "chemical curing agent".

A storage tank 1 for storing a highly heat-resistant polyimide resin solution feeds a resin solution (which is normally a highly heat-resistant polyamic acid solution serving as a precursor) into a mixer 6. A storage tank 3 for storing a solvent feeds a solvent into the mixer 6. The resin solution and the solvent are mixed in the mixer 6. The resin solution thus diluted with the solvent is introduced into a multilayer coextrusion die 11 via a viscometer 10. A storage tank 4 for storing a chemical curing agent feeds a chemical curing agent into the mixer 6 as needed. The chemical curing agent may be fed into a flow channel of the solvent in front of the mixer. Meanwhile, a storage tank 2 for storing a thermoplastic polyimide resin solution feeds a resin solution (which is normally a thermoplastic polyamic acid solution serving as a precursor) into a temperature-control device 7 having a cooling device 8 and a heating device 9. The viscosity of the resin solution is adjusted by adjusting the temperature of the resin solution in the temperature-control device 7. The resin solution is introduced into the multilayer extrusion die 11 via a viscometer 10. Although not shown in FIG. 1, it is possible to adjust the viscosity by feeding the thermoplastic polyimide resin solution with a solvent. In this case, it is possible to omit the temperature-control device 7. Further, it is possible to feed the thermoplastic polyimide resin solution with a chemical curing agent. Furthermore, it is possible to install a temperature-control device 7 in a flow channel of the highly heat-resistant polyimide resin solution.

In FIG. 1, the highly heat-resistant polyimide resin solution is fed into a center flow channel of the multilayer coextrusion die 11, and the thermoplastic polyimide resin solution is fed into right and left flow channels of the multilayer coextrusion die 11. The multilayer coextrusion die 11 flow-casts a multilayer liquid film 12 onto a casting belt 13 made of stainless steel. The multilayer liquid film 12 is dried by heating so as to be further imidized as needed. Thus manufactured is a multilayer polyimide film.

Examples of a die for use in the present invention include, but are not limited to, a feed-block multilayer coextrusion die and a multimanifold multilayer coextrusion die. Because a multimanifold multilayer coextrusion die can achieve high accuracy of thickness of each layer, it is preferable that a multimanifold multilayer coextrusion die be used. In a multimanifold multilayer coextrusion die, each resin solution introduced through a resin inlet of the die is expanded in the width direction in a space, called "manifold", which has a cylindrical or elliptical cross-section. After that, the resin solutions come from flow channels called "prelands" and "lands" and meet to become a multilayered liquid film. Generally, resin solutions are highly viscous liquids. For this reason, the inner pressure of a manifold decreases with distance from a resin inlet. This brings about a distribution of pressure in the width direction. As a result, the thickness of each of the resin solutions meeting after coming from the prelands and the lands tends to decrease with distance from the inlet.

Figure 2:
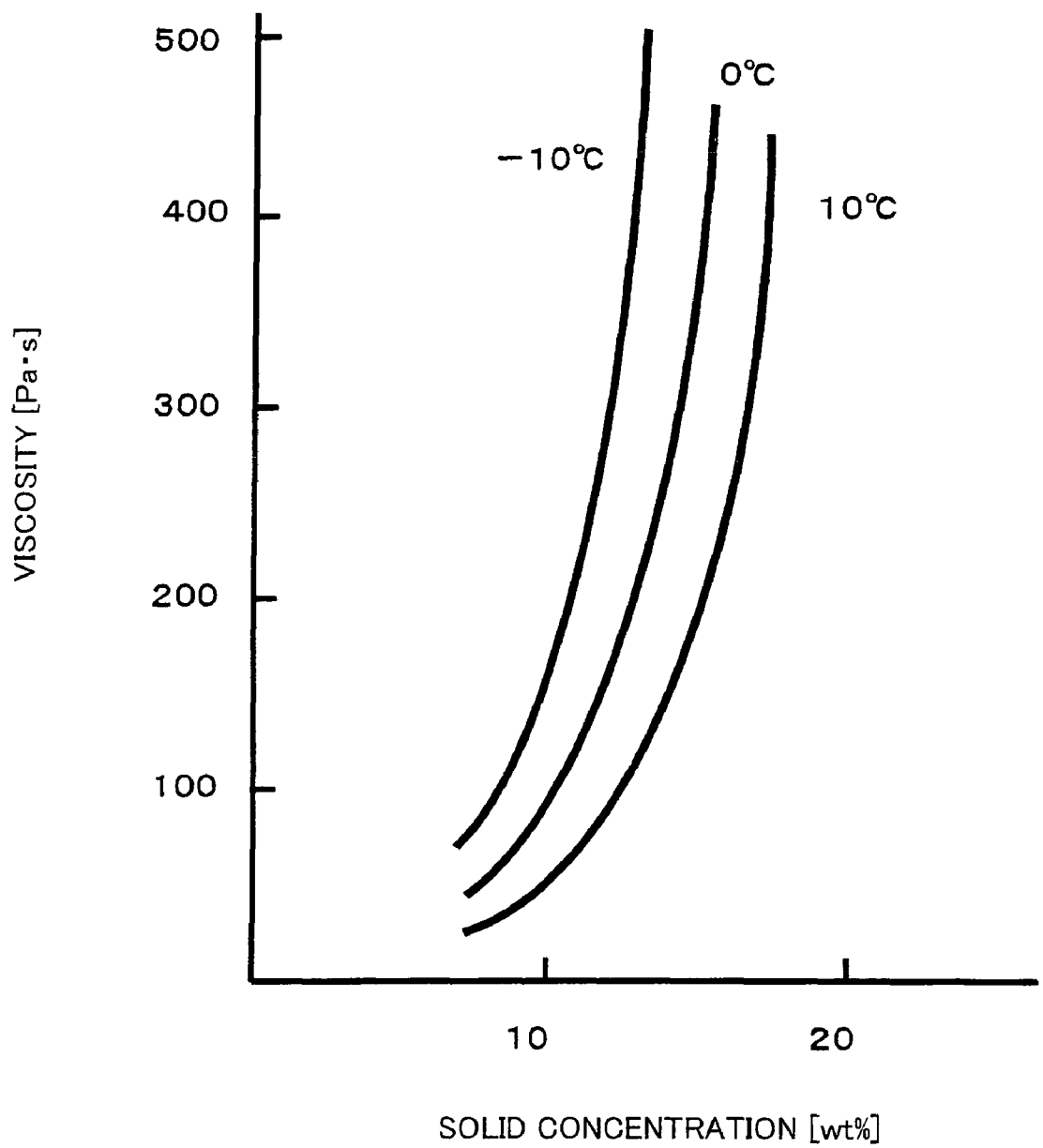
FIG. 2 shows an example of a relationship between the solid concentration of a resin solution and the viscosity of the resin solution.
Figure 3:
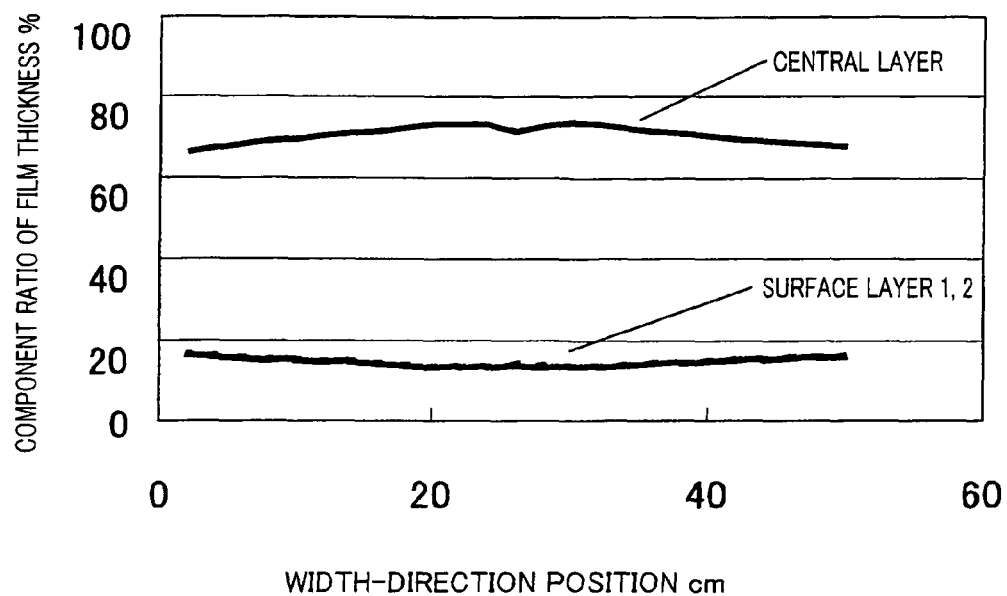
FIG. 3 shows an example of the component ratio of film thickness of a multilayer polyimide film obtained by a coextrusion method.

Conventionally, a distribution of thickness in the width direction has been reduced by appropriately designing the shapes of manifolds, lands, lips, and the like in accordance with the viscous properties of resin solutions flowing into their respective layers. However, in cases where a polyimide film is actually produced, the viscous properties of resin solutions serving as raw materials are not always constant. The viscous properties vary depending on differences in conditions such as the degree of polymerization, the composition, the flow rate, the concentration, and the temperature. For example, as shown in FIG. 2, the viscosity of a resin solution varies greatly depending on slight changes in solid concentration and temperature. Therefore, even if a flow channel of an extrusion die is accurately designed, a resin solution having an accurate viscosity corresponding to the design cannot be supplied. This makes it difficult to obtain a film having a stably uniform distribution of film thickness. For example, the manufacture of a three-layer film by a three-layer coextrusion die may result in a film having such a component ratio of film thickness of each layer as shown in FIG. 3. Further, the efficiency of manufacture may be increased by increasing the discharge rate. Thus, there are often differences in conditions between the actual manufacture of a film and the design of a multilayer extrusion die. Further, even if a resin solution of accurate viscosity corresponding to the design can be supplied, there may be a difference in molecular weight of a polymer. This may result in a solid concentration different from the design solid concentration. This makes it difficult to obtain a desired film.

The method for adjusting film thickness near the exit of lips with use of a heat bolt or a lip heater makes it possible to control the total film thickness of a multilayer film. However, it is difficult to control the component ratio of film thickness of each layer. The method for controlling the component ratio of film thickness of each layer by adjusting the respective temperatures of resin solutions in a die requires a structurally-complex coextrusion die.

The inventors found that the biggest factor in a nonuniform distribution of film thickness is a difference between the viscous properties of resin solutions adopted at the time of design of an extrusion die and the viscosities of resin solutions actually used. Furthermore, the inventors found that a distribution of film thickness of each layer of a polyimide film to be obtained can be controlled by adding a solvent to a resin solution and by adjusting, independently of the amount of the resin solution to be fed, the amount of the solvent to be added.

As shown in FIG. 2, the viscosity of a resin solution varies greatly depending on a slight change in solid concentration. Therefore, it is possible to adjust the viscosity without a substantial change in solid concentration. This makes it possible for the present invention to uniform a distribution of film thickness without a change in film thickness with a slight change in concentration of a resin solution.

In the present invention, it is preferable to manufacture a multilayer polyimide film as follows. First, a multilayer coextrusion die capable of manufacturing a multilayer polyimide film having a desired component ratio of film thickness is manufactured in accordance with data on the viscosities of resin solutions. Next, a multilayer polyimide film is manufactured with use of resin solutions close in viscosity to the resin solutions adopted at the time of design of the multilayer coextrusion die. If nothing is done, it is difficult to obtain the desired multilayer polyimide film. Therefore, the component ratio of film thickness of each layer is controlled by feeding the resin solutions into flow channels in amounts necessary for obtaining the desired film thickness and by adjusting, independently of the amounts of the resin solutions to be fed, the amount of a solvent, such as an organic solvent, to be added. It is preferable that the solvent be added continuously. Usually, the viscosity of each resin solution to be fed into a multilayer extrusion die is preferably close to the viscosity of each resin solution adopted at the time of design of the die. However, there is a case where the ratio of viscosity of each resin should be close to a fixed value. Furthermore, there is a case where the viscosity of each resin solution should be close a value different from the viscosity of each resin solution adopted at the time of design of the die.

The solvent is preferably the same as a solvent used in the resin solution. The solvent is preferably an organic solvent. The solvent is preferably N,N-dimethylformamide (DMF), N,N-dimethylacetoamide (DMAC), or N-methyl-2-pyrrolidone in particular. The range of amount of the solvent to be added to the resin solution is not particularly limited as long as the solvent is added in such an amount that a distribution of film thickness of a film to be obtained becomes uniform. However, an excessively low solid concentration obtained after the solvent has been added to and mixed with the resin solution results in an excessively low viscosity, which makes it difficult to form a film. Further, an excessively high solid concentration results in an excessively high viscosity, which makes it difficult to form a film. Therefore, it is preferable that the solvent be added in such an amount that the solid concentration obtained after the solvent has been added to and mixed with the resin solution falls within a range of 5 wt % to 20 wt %, or more preferably 8 wt % to 15 wt %.

As the mixer for mixing the resin solution and the solvent together, a conventionally used mixer can be used without limitation. Examples of the mixer include mixers, such as a static mixer, a single-screw stirring mixer, and a double-screw stirring mixer, which are capable of continuous mixing.

In the present invention, the solvent may be added to any resin solution. As long as the object of the present invention is attained, the solvent may be added to all the resin solutions that form the multilayer liquid film, or may be added only to an arbitrarily selected resin solution. However, the addition of the solvent to all the resin solutions requires a complex apparatus. Therefore, the method for adding the solvent only to a specific resin solution is preferable. For example, in cases where a multilayer polyimide film in which two outer layers are formed by resin solutions identical in type and thickness to each other and a central layer is formed by a resin solution different in type and thickness from the resin solutions is manufactured by three-layer coextrusion, a deviation in component ratio of film thickness in the width direction of a film to be obtained can be reduced by adding the solvent only to the central layer.

Where to add the solvent to a resin solution is not particularly limited. The solvent may be added in the multilayer coextrusion die, or may be added to a resin solution to be introduced into the multilayer coextrusion die. In order to prevent the apparatus from becoming complex, it is preferable to add the solvent to a resin solution to be introduced into the multilayer coextrusion die.

In order to adjust the viscosity of the present resin solution, it is possible to change the temperature of the resin solution. The viscosity of a resin solution varies greatly depending on a change in temperature; therefore, the viscosity can be adjusted by changing the temperature. It is possible to use a combination of a method for adjusting the viscosity by adding the solvent and a method for adjusting the viscosity by changing the temperature of the resin solution. Further, it is possible to adjust the viscosity by changing only the temperature of the resin solution without adding the solvent. In order to simplify the apparatus, it is preferable that the viscosity of the resin solution discharged from the storage tank be adjusted only by adding the solvent without substantially cooling or heating the resin solution.

As the temperature-control device for adjusting the temperature of the resin solution, a conventionally used temperature-control device can be used without limitation as long as it can continuously change the temperature. Examples of the temperature-control device include a device obtained by directly introducing, into a temperature-control tank, a pipe through which the resin solution passes. It is possible to use a static mixer, having a temperature-control device attached therearound, through which the resin solution passes. It is preferable that the temperature-control device include both a cooling mechanism and a heating mechanism. Specific examples of the cooling mechanism include a brine refrigerating circulator. Specific examples of the heating mechanism include a steam heating device. It is not preferable to adjust the temperature of the resin solution in the multilayer extrusion die, and it is preferable to adjust the temperature of the resin solution between the storage tank and the multilayer extrusion die.

The setting range of temperature of the resin solution is not particularly limited as long as the resin solution is set at such a temperature that a distribution of film thickness of a film to be obtained becomes uniform. However, at a high temperature, the resin solution may proceed with a decomposition reaction or an imidization reaction. At a low temperature, the resin solution may have such a high viscosity that it is difficult to form a film. Therefore, it is preferable that the temperature of the resin solution fall within a range of −30° C. to 60° C. In order to prevent the progress of a hardening reaction of the liquid film in the die in adding a chemical dehydrating agent or a catalyst for accelerating the hardening reaction, it is preferable that the temperature of the resin solution fall within a range of −20° C. to 20° C.

In the present invention, it is preferable that a device for measuring viscosity be installed behind a device for adjusting viscosity and in front of the multilayer extrusion die. The reason for this is as follows: Since the multilayer extrusion die is designed so that the distribution of film thickness is minimized at a fixed viscosity, it is preferable to feed, into the multilayer extrusion die, a resin solution adjusted to the design viscosity.

As the device for measuring viscosity, a conventionally used device can be used without limitation as along as it can be installed at a pipe and can measure viscosity continuously or intermittently. Usable examples of the device for measuring viscosity include a rotation viscometer, a vibration viscometer, an ultrasonic viscometer, a capillary viscometer, and a slit viscometer. Furthermore, the present invention regards, as a viscometer, a device that cannot directly measure viscosity measurement but can measure a parameter corresponding to viscosity. For example, it is possible to use a device, having two barometers respectively disposed in two places at a pipe, which measures a pressure drop. With experimental investigation of a relationship between the pressure drop and the distribution of film thickness of a film, control for obtaining a film having a uniform distribution of film thickness is enabled simply by measuring the pressure drop. It should be noted that it is not necessary to use a viscometer.

Generally, a polyimide is obtained from a polyimide precursor, i.e., polyamic acid through a dehydration ring closure reaction. There are two widely known methods for producing the dehydration ring closure reaction: a thermal curing method for producing the dehydration ring closure reaction only by heat; and a chemical curing method for producing the dehydration ring closure reaction with use of a chemical curing agent. Whether or not to use the chemical curing agent is determined in consideration of the chemical structure of the resin solution, the required rate of reaction, the conditions for drying the liquid film, the conditions for calcinating the film, and the like. The present invention may employ either of the methods. However, in consideration of the efficiency of manufacture, it is particularly preferable to employ the chemical curing method. Furthermore, when the chemical curing agent is added to the resin solution, the chemical curing agent exudes from the resin solution layer as an imidization reaction proceeds, and forms a liquid film between the casting belt and the multilayered gel film. This prevents the gel film from peeling off due to the adhesion of a surface layer of the gel film to the casting belt.

In cases where the chemical curing agent is used, it is preferable that the component ratio of film thickness of each layer be controlled by adjusting, independently of the amounts of the resin solutions to be introduced into their respective flow channels of the multilayer coextrusion die and the amount of the chemical curing agent to be fed, the amount of the solvent to be added. An attempt to prepare a solution by mixing the chemical curing agent and the solvent together in advance with a fixed ratio, to add the solution to the resin solution, and to adjust the amount of the solution to be added results in a change in the amount of the chemical curing agent to be added, and such a change causes a change in properties of a multilayer polyimide film to be obtained. That is, when the chemical curing agent is added in an excessive amount, the resin solution may gelate in the die. When the chemical curing agent is added in an insufficient amount, there may be a reduction in strength of a polyimide multilayer film to be obtained.

Where to add the chemical curing agent is not particularly limited. The chemical curing agent can be added to the solvent in front of the mixing device for adding the solvent to the resin solution. In order to prevent the progress of hardening in the multilayer coextrusion die, it is preferable that the chemical curing agent be added to the mixing device for adding the solvent or added behind the mixing device and in front of the multilayer extrusion die.

In the present invention, the chemical curing agent may be added to any resin solution. The chemical curing agent may be added to all the resin solutions that form the multilayer liquid film, or may be added only to a specific resin solution. In cases where the chemical curing agent is added only to a specific resin solution, the chemical curing agent diffuses from a specific resin solution layer toward an adjacent resin solution layer as imidization proceeds after the formation of a multilayer liquid film. For this reason, the chemical curing agent is supplied to a resin solution layer to which the chemical curing agent has not been added. On the other hand, the addition of the chemical curing agent to all the resin solutions requires a complex apparatus. Therefore, the method for adding the chemical curing agent only to a specific resin solution is preferable. Further, the resin solution layer to which the chemical curing agent has been added may generate gel in the coextrusion die. For this reason, from the viewpoint of preventing the generation of gel, a method for adding the chemical curing agent to a resin solution forming an inner layer and adding no chemical curing agent to a resin solution forming an outer layer is preferable. For example, in the case of three-layer coextrusion, a method for adding the chemical curing agent only to a central layer (which is preferably a highly heat-resistant polyimide layer) and for adding no chemical curing agent to resin solutions respectively serving as two outer layers is preferable. Furthermore, from the viewpoint of simplifying the apparatus, it is most preferable that the chemical curing agent and the solvent be added to the same resin solution.

The present invention employs a coextrusion-casting coating method. The coextrusion-casting coating method is a method for manufacturing a film. The method includes the step of feeding at least two types of resin solutions simultaneously to an extruder having a multilayer extrusion die and extruding a multilayer liquid film from an outlet of the multilayer extrusion die onto a support. The multilayer liquid film extruded from the extrusion die is flow-cast. As a flow-casting device, a known device can be used. Examples of the flow-casting device include, but are not limited to, a rotating roller, a rotating belt, and a move board. For ease of introduction into a drying step after flow casting, it is preferable to use the rotating belt. Each of the rotating roller, the rotating belt, and the move board can be made of metal, cloth, resin, glass, ceramic, or the like. For stability of the structure of a film, it is preferable that each of the rotating roller, the rotating belt, and the move board be made of metal. From the viewpoint of the ease of peeling and corrosion-resistant properties of a film, it is most preferably that each of the rotating roller, the rotating belt, and the move board be made of stainless steel. Furthermore, for the purpose of improving the peeling properties and corrosion-resistant properties of a film, each of the rotating roller, the rotating belt, and the move board that are made of metal can have a surface plated with chromium, nickel, or tin.

The liquid film thus flow-cast is dried in a drying furnace and molded into a gel film. The present invention can employ a known drying furnace as the drying furnace. Examples of the drying furnace include, but are not limited to, a hot-air drying furnace and an infrared drying furnace. From the viewpoint of drying the solvent efficiently, the hot-air drying furnace is preferable. An excessively low drying temperature results in insufficient drying. An excessively high drying temperature causes the contained solvent to boil, and therefore may inhibit the formation of a flat and smooth film. In particular, a thin surface layer, such as a thermoplastic polyimide layer, which serves as an adhesive layer is likely to suffer from minute defects. Therefore, it is preferable that the drying temperature be less than 50° C. plus the boiling point of the solvent. Specifically, it is preferable that the drying temperature fall within a range of not less than 80° C. to not more than 200, or more preferably not less than 100° C. to not more than 150° C. By emitting at least part of the solvent, a self-supporting multilayer film is obtained.

The film thus dried in the drying furnace still remains with the solvent and has not been sufficiently imidized. As such, the film is further dried in a calcination furnace and completely imidized. As the calcination furnace, a known calcination furnace can be used. Examples of the calcination furnace include, but are not limited to, a hot-air calcination furnace and an infrared calcination furnace. It is preferable to use a combination of these calcination furnaces in accordance with the degree of calcination. It is preferable that the film be heated at 100° C. to 500° C. in the hot-air calcination furnace and then heated at 300° C. to 600° C. in the infrared calcination furnace. As for the imidization time, it is only necessary to take sufficient time for the film to be substantially completely imidized and dried. Although not uniquely defined, the imidization time is generally set appropriately so as to fall within a range of approximately 10 seconds to 1,800 seconds.

The multilayer film to be introduced into the calcination furnace may remain on the support or may be peeled away from the support. Further, for the purpose of improving the melting fluidity of a layer that serves as an adhesive layer, the imidization ratio may be intentionally lowered or the solvent may be intentionally left. This brings about improvement in adhesiveness to a conductor such as copper foil.

It is preferable that the tension of the film being imidized fall within a range of 1 kg/m to 15 kg/m, or more preferably 5 kg/m to 10 kg/m. When the tension falls short of the range, the film sags or meanders when conveyed, and may therefore crease when wound or may not be uniformly wound, for example. On the other hand, when the tension exceeds the range, the film is heated at a high temperature under high tension. This may cause deterioration in dimensional stability of an adhesive film to be obtained.

As a polyimide for use in the present invention and a precursor thereof, a conventionally used polyimide and a precursor thereof can be used without limitation. The most common polyimide is synthesized by polymerizing anhydrous pyromellitic acid and diaminophenyl ether dissolved in a solvent such as DMF or DMAC and by chemically or thermally dehydrating a precursor (polyamic acid) thus obtained. The polyimide for use in the present invention and the precursor thereof are not limited to the above polyimide and the precursor thereof, and only need to be substances, obtained by copolymerizing any substance selected from anhydrous pyromellitic acid, diaminophenyl ether, other acid dianhydride compounds, other diamine compounds, and other compounds, which have a polyimide skeleton or a polyamic acid skeleton.

Generally, the solubility of a polyimide in various solvents is often low. In cases where the solubility of a target polyimide in the solvent is sufficiently high, the polyimide may be dissolved in the solvent for use. In cases where the solubility is insufficient, polyamic acid serving as a precursor of the corresponding polyimide may be dissolved in the solvent for use.

As described above, it is preferable that the multilayer polyimide film be a film having a highly heat-resistant polyimide layer as an inner layer and a thermoplastic polyimide layer as a surface layer that adheres to metal foil.

The following describes the highly heat-resistant polyimide layer and the thermoplastic polyimide layer.

(Highly Heat-Resistant Polyimide Layer)

Usually, a highly heat-resistant polyimide is a non-thermoplastic polyimide. It is preferable that the highly heat-resistant polyimide layer of the present invention contains a non-thermoplastic polyimide at not less than 90 wt %. The thickness of the highly heat-resistant polyimide layer is not particularly limited. Usually, a highly heat-resistant polyimide such as a non-thermoplastic polyimide is manufactured by using polyamic acid as a precursor. The polyamic acid can be manufactured by a publicly-known method. Usually, the polyamic acid is manufactured by dissolving substantially equimolar amounts of aromatic tetracarboxylic acid dianhydride and aromatic diamine in an organic solvent and by stirring the resulting polyamic acid organic solvent solution under controlled temperature conditions until completion of polymerization of the acid dianhydride and the diamine. Usually, such a polyamic acid solution is obtained in a concentration of 5 wt % to 35 wt %, or preferably 10 wt % to 30 wt %. In cases where the concentration falls within this range, an appropriate molecular weight and an appropriate solution viscosity are obtained.

The polymerization method can be any one of the publicly-known methods or a combination of those methods. During the polymerization of the polyamic acid, the properties of a polyimide to be obtained can be controlled by controlling the order in which monomers are added. Therefore, the polyamic acid for use in the present invention can be polymerized by using any method for adding a monomer. Typical examples include the following methods:

(1) A method for performing polymerization by dissolving aromatic diamine in an organic polar solvent and by allowing the aromatic diamine to react with a substantially equimolar amount of aromatic tetracarboxylic acid dianhydride.

(2) A method for, by allowing aromatic tetracarboxylic acid dianhydride and an excessively smaller molar quantity of aromatic diamine compound to react with each other in an organic polar solvent, obtaining a prepolymer having acid anhydride groups at both terminals thereof; and then performing polymerization with use of the aromatic diamine compound so that the aromatic tetracarboxylic acid dianhydride and the aromatic diamine compound are used in substantially equimolar amounts.

(3) A method for, by allowing aromatic tetracarboxylic acid dianhydride and an excessive molar quantity of aromatic diamine compound to react with each other in an organic polar solvent, obtaining a prepolymer having amino groups at both terminals thereof; and then performing polymerization with use of the aromatic tetracarboxylic acid dianhydride so that the aromatic tetracarboxylic acid dianhydride and the aromatic diamine compound are used in substantially equimolar amounts.

(4) A method for, after dissolving and/or dispersing aromatic tetracarboxylic acid dianhydride in an organic polar solvent, performing polymerization with use of an aromatic diamine compound so that the aromatic tetracarboxylic acid dianhydride and the aromatic diamine compound are in substantially equimolar amounts.

(5) A method for performing polymerization by allowing a mixture of substantially equimolar amounts of aromatic tetracarboxylic acid dianhydride and aromatic diamine to react in an organic polar solvent.

These methods may be used alone, or may be partially combined for use.

As a highly heat-resistant polyimide material, a prepolymer obtained by using a diamine component having a rigid structure to be described later is preferably used. Use of the prepolymer results in a polyimide film having a high modulus of elasticity and a small coefficient of hygroscopic expansion. It is preferable that the molar ratio of the rigidly-structured diamine to the acid dianhydride in the preparation of the prepolymer fall within a range of 100:70 to 100:99 or 70:100 to 99:100, or more preferably 100:75 to 100:90 or 75:100 to 90:100. When the ratio of the rigidly-structured diamine falls short of the range, it is hard to bring about improvement in modulus of elasticity and in coefficient of hygroscopic expansion. Above the range, there may be an excessive reduction in coefficient of linear expansion or a reduction in tensile elongation.

Examples of a tetracarboxylic acid anhydride that can be used as a highly heat-resistant polyimide material include pyromellitic acid dianhydride, 2,3,6,7-naphthalene tetracarboxylic acid dianhydride, 3,3',4,4'-biphenyl tetracarboxylic acid dianhydride, 1,2,5,6-naphthalene tetracarboxylic acid dianhydride, 2,2',3,3'-biphenyl tetracarboxylic acid dianhydride, 3,3',4,4'-benzophenone tetracarboxylic acid dianhydride, 4,4'-oxydiphthalic acid dianhydride, 2,2-bis(3,4-dicarboxyphenyl)propane dianhydride, 3,4,9,10-perylene tetracarboxylic acid dianhydride, bis(3,4-dicarboxyphenyl) propane dianhydride, 1,1-bis(2,3-dicarboxyphenyl)ethane dianhydride, 1,1-bis(3,4-dicarboxyphenyl)ethane dianhydride, bis(2,3-dicarboxyphenyl) methane dianhydride, bis(3,4-dicarboxyphenyl)ethane dianhydride, bis(3,4-dicarboxyphenyl)sulfonic dianhydride, p-phenylene bis(trimellitic acid monoester anhydride), ethylene bis(trimellitic acid monoester anhydride), bisphenol A bis(trimellitic acid monoester anhydride), and compounds similar thereto. These acid dianhydrides may be used alone, or may be mixed at a given ratio.

Among these acid dianhydrides, at least one type selected from the group consisting of pyromellitic acid dianhydride, 3,3',4,4'-benzophenone tetracarboxylic acid dianhydride, 4,4'-oxydiphthalic acid dianhydride, and 3,3',4,4'-biphenyl tetracarboxylic acid dianhydride is preferably used in particular.

Further, among these acid dianhydrides, at least one type selected from the group consisting of 3,3',4,4'-benzophenone tetracarboxylic acid dianhydride, 4,4'-oxydiphthalic acid dianhydride, and 3,3',4,4'-biphenyl tetracarboxylic acid dianhydride is preferably used in an amount of not more than 60 mol %, more preferably not more than 55 mol %, or still more preferably not more than 50 mol %, with respect to the entire acid dianhydrides. When the amount exceeds the range, the polyimide film may have too low a glass-transition temperature and too low a storage modulus of elasticity at the time of heating to form a film.

Further, in cases where pyromellitic acid dianhydride is used, the pyromellitic acid dianhydride is preferably used in an amount of 40 mol % to 100 mol %, more preferably 45 mol % to 100 mol %, or still more preferably 50 mol % to 100 mol %. Use of the pyromellitic acid dianhydride within this range makes it easy to keep the glass-transition temperature of the polyimide film within an appropriate range and to keep the storage modulus of elasticity of the polyimide film at the time of heating within an appropriate range.

Appropriate examples of a diamine that can be used as a non-thermoplastic polyimide material include 4,4'-diaminodiphenylpropane, 4,4'-diaminodiphenylmethane, benzidine, 3,3'-dichlorobenzidine, 3,3'-dimethylbenzidine, 2,2'-dimethylbenzidine, 3,3'-dimethoxybenzidine, 2,2'-dimethoxybenzidine, 4,4'-diaminodiphenylsulfide, 3,3'-diaminodiphenylsulfone, 4,4'-diaminodiphenylsulfone, 4,4'-oxydianiline, 3,3'-oxydianiline, 3,4'-oxydianiline, 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene, bis{4-(4-aminophenoxy)phenyl}sulfone, bis{4-(4-aminophenoxy)phenyl}propane, bis{4-(3-aminophenoxy)phenyl}sulfone, 4,4'-bis(4-aminophenoxy)biphenyl, 4,4'-bis(3-aminophenoxy)biphenyl, 1,3-bis(3-aminophenoxy)benzene, 1,3-bis(4- aminophenoxy)benzene, 1,3-bis(4-aminophenoxy)benzene, 1,3-bis(3-aminophenoxy)benzene, 3,3'-diaminobenzophenone, 4,4'-diaminobenzophenoe, and compounds similar thereto.

As the diamine component, a combination of a diamine having a rigid structure and an amine having a flexible structure can be used. In that case, it is preferable that the molar ratio of the rigidly-structured diamine to the flexibly-structured amine fall within a range of 80/20 to 20/80, more preferably 70/30 to 30 to 70, or still more preferably 60/40 to 30/70. When the rigidly-structured diamine exceeds the range, there tends to be a reduction in tensile elongation of a film to be obtained. Further, below the range, the glass-transition temperature and the storage modulus of elasticity at the time of heating become too low to form a film.

In the present invention, the rigidly-structured diamine is represented below by General Formula (1):

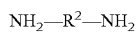
General Formula (1)

(where $R^2$ is a group selected from the group consisting of bivalent aromatic groups represented below by Group of General Formulas (1):

Group of General Formulas (1)

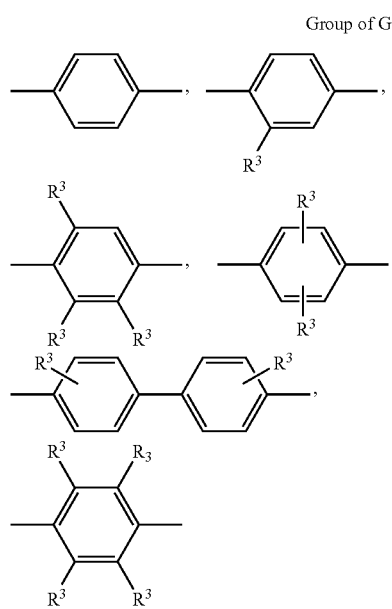

where $R^3$s are each independently a group selected from the group consisting of H—, $CH_3$—, —OH, —$CF_3$, —$SO_3H$, —COOH, —CO—$NH_2$, Cl—, Br—, F—, and $CH_3O$—).

Further, the flexibly-structured diamine is a diamine having a group, such as an ether group, a sulfone group, a ketone group, or a sulfide group, which gives a flexible structure, and is preferably represented below by General Formula (2):

General Formula (2)

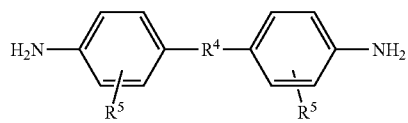

(where $R^4$ is a group selected from the group consisting of bivalent organic groups represented below by Group of General Formulas (2)

Group of General Formulas (2)

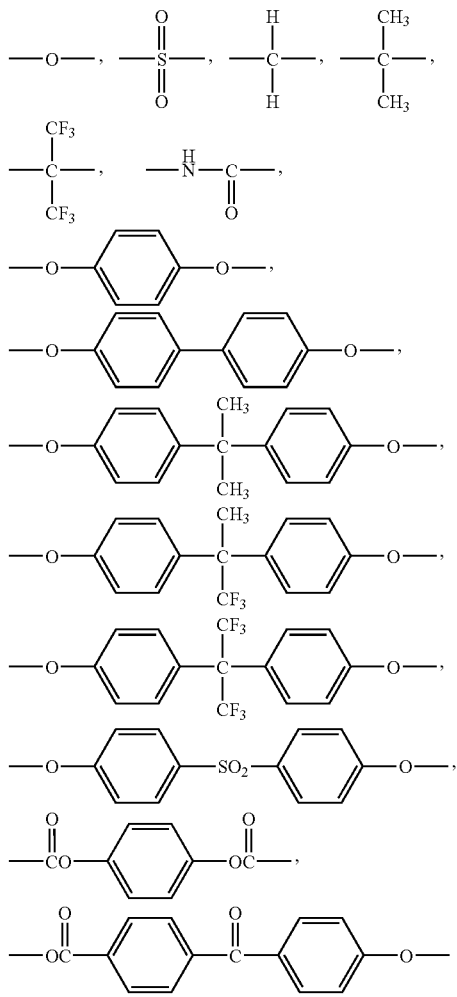

and $R^5$s are each independently is a group selected from the group consisting of H—, $CH_3$—, —OH, —$CF_3$, —$SO_3H$, —COOH, —CO—$NH_2$, Cl—, Br—, F—, and $CH_3O$—).

The highly heat-resistant polyimide layer for use in the present invention can be obtained with use of an appropriate type of aromatic acid dianhydride, an appropriate type of aromatic diamine, and an appropriate blending ratio so as to have desired properties within the aforementioned ranges.

The polyamic acid can be synthesized with use of any solvent in which the polyamic acid is dissolved. Preferred examples of such a solvent include amide solvents such as N,N-dimethylformamide, N,N-dimethylacetoamide, and N-methyl-2-pyrrolidone. Among them, N,N-dimethylformamide and N,N-dimethylacetoamide are preferable in particular.

Further, a filler may be used for the purpose of improving such properties of the film as slidability, thermal conductivity, electrical conductivity, corona resistance, and loop stiffness. Any filler may be used. However, preferred examples of the filler include silica, titanium oxide, alumina, silicon nitride, boron nitride, calcium hydrogen phosphate, calcium phosphate, and mica.

The particle diameter of the filler is determined by those properties of the film which are to be improved and the type of filler that is used, and therefore is not particularly limited.

However, in general, it is preferable that the filler have an average particle diameter falling within a range of 0.05 µm to 100 µm, more preferably 0.1 µm to 75 µm, still more preferably 0.1 µm to 50 µm, or even more preferably 0.1 µm to 25 µm. When the particle diameter falls short of this range, there is no remarkable improvement effect. When the particle diameter exceeds this range, there is a possibility of greatly impairing surface properties or causing great deterioration in mechanical properties. Further, the amount in which the filler is to be added is also determined by those properties of the film which are to be improved and the particle diameter of the filler, and therefore is not particularly limited. In general, it is preferable that the amount in which the filler is to be added fall within a range of 0.01 to 100 parts by weight, more preferably 0.01 to 90 parts by weight, or still more preferably 0.02 to 80 parts by weight, with respect to 100 parts by weight of polyimide. When the amount in which the filler is to be added falls short of this range, there is no remarkable improvement effect. When the amount in which the filler is to be added exceeds this range, there is a possibility of greatly impairing surface properties or causing great deterioration in mechanical properties.

The filler may be added by any method such as follows:

(a) A method for adding a filler to a polymerization reaction liquid before or during polymerization.

(b) A method for kneading a filler, for example, with use of a three-roll after completion of polymerization.

(c) A method for preparing a filler-containing dispersion liquid, and for mixing the filler-containing dispersion liquid into a polyamic acid organic solvent solution.

However, the method for mixing a filler-containing dispersion liquid into a polyamic acid organic solvent solution or, in particular, the method for mixing a filler-containing dispersion liquid into a polyamic acid organic solvent solution immediately before film formation is preferable because it minimizes contamination of a manufacturing line by the filler. In the case of preparation of a dispersion liquid containing a filler, it is preferable to use the same solvent as the solvent used in polymerizing the polyamic acid. Further, in order to satisfactorily disperse the filler in a stable dispersion state, it is possible to use a dispersing agent, a thickening agent, and the like to such an extent as not to affect the properties of the film.

(Thermoplastic Polyimide Layer)

The thermoplastic polyimide layer is not particularly limited in terms of amount of a thermoplastic polyimide resin that is contained in the layer, molecular structure, and thickness, as long as the thermoplastic polyimide layer expresses desired properties such as a desired strength of adhesion to a conductor such as copper foil and a desired coefficient of linear expansion. However, in order to express the desired properties, it is preferable that the content of the thermoplastic polyimide resin be substantially not less than 50 wt %. Examples of the thermoplastic polyimide include thermoplastic polyimide, thermoplastic polyamide imide, thermoplastic polyether imide, and thermoplastic polyester imide. Among them, thermoplastic polyester imide is preferable from the point of view of low hygroscopic properties.

The thermoplastic polyimide is obtained from polyamic acid serving as a precursor thereof. As the polyamic acid, publicly-known polyamic acid can be used. As with the precursor of the highly heat-resistant polyimide layer, the polyamic acid can be manufactured by a publicly-known method.

From the point of view of the strength of adhesion to a conductor layer and the heat resistance of a metal-clad laminate to be obtained, it is preferable that the glass-transition temperature (Tg) of the thermoplastic polyimide of the present invention fall within a range of 150° C. to 300° C. It should be noted that Tg can be calculated from the value of an inflection point of a storage modulus of elasticity measured by a dynamic viscoelasticity measuring apparatus (DMA).

The properties of the thermoplastic polyimide can be adjusted by various combinations of materials to be used. Usually, an increase in ratio of rigidly-structured diamine used causes an increase in glass-transition temperature and an increase in storage modulus of elasticity at the time of heating, thereby undesirably causing a reduction in adhesiveness and processability. The ratio of rigidly-structured diamine is preferably not more than 40 mol %, more preferably not more than 30 mol %, or still more preferably not more than 20 mol %. Specific examples of a preferable thermoplastic polyimide resin include a product of a reaction of polymerization of acid dianhydride containing biphenyl tetracarboxylic acid dianhydrides and diamine having an aminophenoxy group.

For the purpose of controlling the properties of the film, the thermoplastic polyimide may be put with an inorganic or organic filler and another resin.

The thermoplastic polyimide can be manufactured with use of any solvent in which a polyimide or polyamic acid compound is dissolved. Examples of such a solvent include: sulfoxide solvents such as dimethyl sulfoxide and diethyl sulfoxide; formamide solvents such as N,N-dimethyl formamide and N,N-diethyl formamide; acetoamide solvents such as N,N-dimethyl acetoamide and N,N-diethyl acetoamide; pyrrolidone solvents such as N-methyl-2-pyrrolidone and N-vinyl-2-pyrrolidone; phenol solvents such as phenol, o-, m-, or p-cresol, xylenol, halogenated phenols, and catechol; ether solvents such as tetrahydrofuran, dioxane, and dioxolan; alcohol solvents such as methanol, ethanol, and butanol; cellosolve solvents such as butylcelloslve; hexamethyl phosphoramide; and γ-butyrolactone. It is preferable that these solvents be used alone or in combination. Furthermore, it is possible to use an aromatic hydrocarbon such as xylene or toluene. Among them, the formamide solvents such as N,N-dimethyl formamide and N,N-diethyl formamide are preferable in particular. Further, in order to accelerate decomposition of the polyamic acid, it is necessary to remove as much water as possible from the solvent.

It is possible to use a chemical dehydrating agent in obtaining a polyimide from the polyamic acid. The chemical dehydrating agent serves as a dehydration ring closure agent for the polyamic acid. Preferably usable examples of the chemical dehydrating agent include aliphatic acid anhydride, aromatic acid anhydride, N,N'-dialkylcarbodiimide, lower aliphatic halide, halogenated lower aliphatic acid anhydride, arylsulfonic acid dihalide, thionyl halide, and a mixture of two or more of them. Among them, aliphatic acid anhydride and aromatic acid anhydride are preferable from the point of view of excellent dehydrating action, and acetic anhydride is preferable in particular.

It is preferable that the chemical dehydrating agent be added in an amount of 0.5 mol to 4.0 mol, more preferably 0.7 mol to 4.0 mol, or still more preferably 1.0 mol to 4.0 mol or 0.7 mol to 2 mol, with respect to 1 mol of amic acid unit contained in the polyamic acid. An excessively large amount of the chemical dehydrating agent causes a rapid hardening of the liquid film, thereby making it difficult to appropriately control the shape of the liquid film. Further, the solvent may stay between layers of the multilayer film to cause delamination. On the other hand, an excessively small amount of the chemical dehydrating agent results in insufficient progress of imidization, and may make it impossible to obtain a film of desired properties.

It is possible to use an imidization catalyst in obtaining a polyimide from the polyamic acid. The imidization catalyst has an effect of enhancing the dehydration ring closure action of the chemical dehydrating agent with respect to the polyamic acid. Examples of the imidization catalyst include aliphatic tertiary amines, aromatic tertiary amines, and heterocyclic tertiary amines. Among them, a nitrogen-containing heterocyclic compound such as imidazole, benzimidazole, isoquinoline, quinoline, or β-picoline is preferable in particular.

It is preferable that the imidization catalyst be added in an amount of 0.05 mol to 3 mol, more preferably 0.05 mol to 2 mol, still more preferably 0.1 mol to 2 mol, or particularly preferably 0.2 mol to 2 mol, with respect to 1 mol of amic acid unit contained in the polyamic acid. An excessively large amount of the imidization catalyst causes a rapid hardening of the liquid film, thereby making it difficult to appropriately control the shape of the liquid film. Further, the catalyst may stay in the polyimide layer to cause deterioration in long-term heat resistance. On the other hand, an excessively small amount of the imidization catalyst prevents the polyimide precursor from being sufficiently polyimidized at the time of thermal drying, and may make it impossible to obtain a film of desired properties.

The chemical dehydrating agent and the imidization catalyst may be separately added to the resin solution, or may be mixed in advance to be added to the resin solution. A solution prepared by dissolving the chemical dehydrating agent and the imidization catalyst in a solvent may be added to the resin solution. Furthermore, it is possible to appropriately choose to introduce an organic polar solvent into a solution composed of the chemical dehydrating agent and the catalyst.

A manufacturing method of the present invention makes it possible to obtain a multilayer polyimide film having a small deviation in component ratio of film thickness in the film-width direction. The deviation in component ratio of film thickness preferably fall within a range of not less than −10% to not more than 10%, more preferably not less than −5% to not more than 5%, or still more preferably not less than −3% to not more than 3%. Further, the manufacturing method of the present invention makes it possible to obtain a multilayer polyimide film having a small deviation in rate of dimensional change of the machine direction in the film-width direction. The deviation in rate of dimensional change preferably falls within a range of not less than −0.05% to 0.05%, or more preferably not less than −0.03% to not more than 0.03%. Beyond the range, there are great variations in rate of dimensional change in the width direction. Such variations may induce creases when metal foil is laminated by heat-roller lamination.

In the case of a film having n layers, parameters concerning the component ratio of film thickness can be obtained as follows:

(1) Component Ratio of Film Thickness

A plurality of points 1 to k are placed at regular intervals (usually of 20 mm) in the film-width direction. The component ratio of film thickness of the mth layer at the point j ($R_{j,m}(\%)$) is calculated by the following formula:

$$R_{j,m}(\%) = d_{j,m}/d_{j,total} \times 100$$

where $d_{j,m}$ is the film thickness of the mth layer at the point j and $d_{j,total}$ is the total film thickness at the point j.

(2) Deviation in Component Ratio of Film Thickness

The deviation in component ratio of film thickness of the mth layer at the point j ($\sigma_{j,m}$) is calculated by the following formula:

$$\sigma_{j,m} = R_{j,m} - R_{average,m}$$

where $R_{average,m}$ is the average component ratio of film thickness of the mth layer at the points 1 to k.

FIG. 3 shows a deviation in typical component ratio of film thickness in the width direction of a multilayer film obtained by a three-layer coextrusion technique.

There are no certain limits on how to measure film thickness, as long as the thickness of each layer of a multilayer polyimide can be measured. Optical interferometric film-thickness measuring methods are preferable because they can measure the respective film thicknesses of a plurality of layers quickly. Among the optical interferometric film-thickness measuring methods, a method for measuring film thickness by Fourier transform of an interference pattern of reflected light is most preferable because of its high accuracy. The present invention employs such a noncontact multilayer film thickness meter (FTR-4100; manufactured by JASCO Corporation). Further, in examples of the present invention, the thickness of each layer was measured at measuring points placed at intervals of 20 mm in the film-width direction.

In the present invention, parameters concerning the rate of dimensional change can be obtained as follows:

(1) Rate of Dimensional Change

Figure 4:
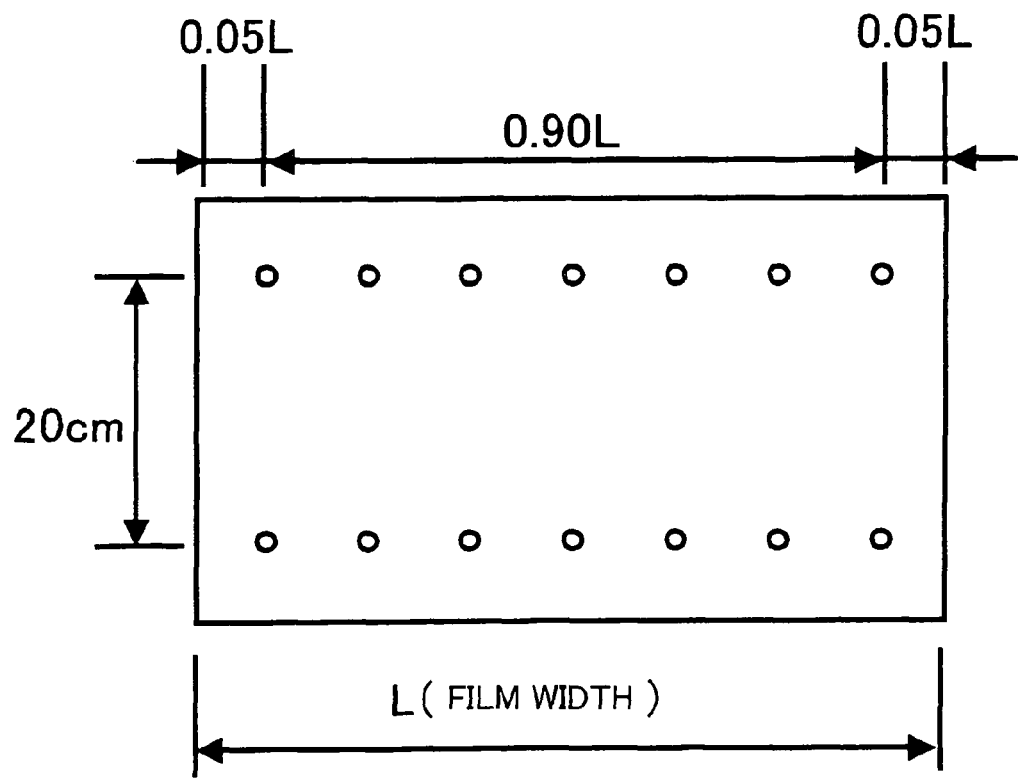
FIG. 4 is a pattern diagram of a sample for use in measurement of a rate of dimensional change.

Copper foil is laminated on a multilayer polyimide film. As shown in FIG. 4, points 1 to k are placed at regular intervals of approximately 5 cm to 10 cm in the width direction of the laminate film. It should be noted that the points are placed at intervals of approximately 7.5 cm in the examples of the present invention. At each point and a point at a distance of 20 cm from that point in the machine direction (length direction) of the film, k pairs of holes are formed, and the distance between the holes of each of the k pairs of holes was measured. Next, the metal foil is removed from the flexible laminate by etching. After that, the flexible laminate is left in a temperature-controlled room at 20° C. and 60% RH for 24 hours. After that, the flexible laminate is heated at 250° C. for 30 minutes, and then left in a temperature-controlled room at 20° C. and 60% RH for 24 hours. After that, the distance between each of the k pairs of holes is measured. The etching solution is usually an aqueous solution of hydrochloric acid and ferric chloride. The etching temperature is room temperature. A change in etching solution or in etching temperature hardly causes a change in rate of dimensional change.

The rate of dimensional change at the point j ($D_j(\%)$) is calculated by the following formula:

$$D_j(\%) = (L_j - L_{j,O})/L_{j,O} \times 100$$

where $L_{j,O}$ is the distance between the holes before the removal of the copper foil and $L_j$ is the distance between the holes after the treatment.

(2) Deviation in Rate of Dimensional Change

The deviation in rate of dimensional change at the point j ($\sigma_j$) is calculated by the following formula:

$$\sigma_j = D_j - D_{average}$$

where $D_{average}$ is the average rate of dimensional change at the points 1 to k.

Usually, the component ratio of film thickness of a coextruded polyimide film and the rate of dimensional change of a coextruded polyimide film do not fluctuate in the length direction. That is, the deviation of a coextruded film in the length direction is small. Therefore, at a given point of the length direction, profiles of the component ratio of film thickness and the rate of dimensional change in the width direction are the same as those at another point of the length direction.

The range of width within which to evaluate deviations in component ratio of film thickness and rate of dimensional change in the film-width direction is preferably the width of a film on which metal foil is being laminated. Usually, the width of such a film is approximately 500 mm. Furthermore, the range of width within which to make evaluations may be substantially the same as the width of a coating film flow-cast from a multilayer extrusion die. The phrase "substantially the same as the width of a coating film flow-cast from a multilayer extrusion die" refers to the width of the central 90% or more of a film to be finally obtained by excluding the width of a loss made by neck in or crust trimmings. For example, in cases where an adhesive film to be finally obtained has a width of 1,000 mm, its central portion has a width of not less than 900 mm. However, a great width may make it difficult to laminate metal foil on the adhesive film. In that case, the film is cut into slits. In this case, the deviations in component ratio of film thickness and rate of dimensional change in the width direction of the present invention are calculated by converting the width of each slit into the width of the film yet to be cut into slits.

EXAMPLES

The present invention will be fully described below by way of Examples. However, the present invention is not limited to these Examples.

Example of Synthesis 1

Synthesis of a Precursor of a Highly Heat-Resistant Polyimide Compound

In 239 kg of N,N-dimethylformamide (DMF) cooled down to 10° C., 6.9 kg of 4,4'-oxydianiline (ODA), 6.2 kg of p-phenylenediamine (p-PDA), and 9.4 kg of 2,2-bis[4-(4-aminophenoxy)phenyl]propane (BAPP) were dissolved. To the reaction liquid, 10.4 kg of pyromellitic acid dianhydride (PMDA) were added, and then dissolved by stirring the reaction liquid for one hour. To the reaction liquid, 20.3 kg of benzophenone tetracarboxylic acid dianhydride (BTDA) were added, and then dissolved by stirring the reaction liquid for one hour. A DMF solution of PMDA (PMDA:DMF=0.9 kg:7.0 kg) prepared separately was gradually added to the reaction liquid, and the addition was stopped when the viscosity reached approximately 3,000 poise. The reaction liquid was stirred for one hour. Thus obtained was a polyamic acid solution (hereinafter referred to as "Resin Solution 1"), serving as a precursor of a highly heat-resistant polyimide, which has a solid concentration of 18 wt % and a rotational viscosity of 3,500 poise at 23° C.

Example of Synthesis 2

Synthesis of a Thermoplastic Polyimide Precursor Solution

Into a reaction vessel having a capacity of 350 L, 248 kg of dimethylformamide (DMF) and 17.5 kg of 3,3',4,4'-biphenyl tetracarboxylic acid dianhydride (BPDA) were poured. To the reaction solution being stirred in a nitrogen atmosphere, 24.0 kg of 2,2-bis[4-(4-aminophenoxy)phenyl]propane (BAPP) were gradually added. A solution prepared separately by dissolving 0.5 kg of BPDA in 10 kg of DMF was gradually added to and stirred in the reaction solution with attention paid to the viscosity. The addition and the stirring were stopped when the viscosity reached 1,000 poise. Thus obtained was a polyamic acid solution (hereinafter referred to as "Resin Solution 2") having a solid concentration of 17 wt %.

Example of Synthesis 3

Synthesis of a Thermoplastic Polyimide Precursor Solution

Into a reaction vessel having a capacity of 350 L, 248 kg of dimethylformamide (DMF) and 17.5 kg of 3,3',4,4'-biphenyl tetracarboxylic acid dianhydride (BPDA) were poured. To the reaction solution being stirred in a nitrogen atmosphere, 24.0 kg of 2,2-bis[4-(4-aminophenoxy)phenyl]propane (BAPP) were gradually added. A solution prepared separately by dissolving 0.5 kg of BPDA in 10 kg of DMF was gradually added to and stirred in the reaction solution with attention paid to the viscosity. The addition and the stirring were stopped when the viscosity reached 400 poise. Thus obtained was a polyamic acid solution (hereinafter referred to as "Resin Solution 3").

Example of Synthesis 4

Synthesis of a Precursor of a Thermoplastic Polyimide Compound

Into a reaction vessel having a capacity of 350 L, 190 kg of DMF and 28.9 kg of 2,2-bis[4-(4-aminophenoxy)phenyl]propane (BAPP) were poured. To the reaction solution being stirred in a nitrogen atmosphere, 19.7 kg of 3,3',4,4'-biphenyl tetracarboxylic acid dianhydride (BPDA) were gradually added. Subsequently, 1.0 kg of ethylene bis(trimellitic acid monoester anhydride) (TMEG) was added, and then stirred for 30 minutes in an ice bath. A solution prepared separately by dissolving 0.5 kg of TMEG in 10 kg of DMF was gradually added to and stirred in the reaction solution with attention paid to the viscosity. The stirring was performed for one hour. The addition and the stirring were stopped when the solid concentration reached 20 wt % and the rotational viscosity at 23° C. reached 3,000 poise. Thus obtained was a polyamic acid solution (hereinafter referred to as "Resin Solution 4") serving as a precursor of a thermoplastic polyimide compound.

Example 1 and Comparative Example 1

A multilayer polyimide film (adhesive film) was manufactured with Resin Solutions 1 and 2 by the apparatus of FIG. 1. However, the temperature-control devices 7 were not used. As the extrusion die, a multimanifold three-layer coextrusion die having a lip width of 650 mm and a lip gap of 0.8 mm was used. The temperatures of all the devices of FIG. 1 were adjusted to 0° C.

A resin storage tank was filled with Resin Solution 1. Resin Solution 1 was introduced from the resin storage tank into a mixer at a speed of 5.2 kg/hr in Example 1 or at a speed of 6.5 kg/hr in Comparative Example 1. DMF was added as a solvent to Resin Solution 1 through another feed port of the mixer in an amount shown in Table 1. The solution thus mixed and diluted in the mixer was introduced into that flow channel of the three-layer coextrusion die (having a lip width of 650 mm and a lip gap of 0.8 mm) which corresponds to a central layer. Meanwhile, DMF was added as a solvent to Resin Solution 2 obtained in Example of Synthesis 2, so that the solid content was adjusted to 15%. Resin Solution 2, whose solid content has been adjusted, was introduced at a speed of 1.00 kg/hr in Example 1 or at a speed of 1.25 kg/hr in Comparative Example 1 into those two flow channels of the three-layer coextrusion die which correspond respectively to two surface layers.

The multilayer liquid film extruded from the gap between the lips of the extrusion die was flow-cast onto a substrate film fixed on a casting belt, and a film was formed while moving the substrate film. In Example 1, the speed of movement of the substrate film, i.e., the speed of film formation was 1.34 m/min. In Comparative Example 1, the speed of film formation was 1.68 m/min. After that, the multilayer liquid film on the substrate film was heated at 130° C. for 420 seconds, and thus transformed into a gel film. Furthermore, the multilayer gel film was dried and imidized at 150° C. for 10 minutes, at 200° C. for 10 minutes, at 250° C. for 5 minutes, and then at 350° C. for 5 minutes. Thus obtained was a multilayer polyimide film, composed of a thermoplastic polyimide layer, a highly heat-resistant polyimide layer, and a thermoplastic polyimide layer, which has a width of approximately 50 cm.

Each of the layers of the multilayer polyimide film thus obtained was measured with use of an optical interferometric film-thickness measuring device. The film thickness of each layer was measured at intervals of 2 cm in the width direction, and the deviation $\sigma_{j-m}$ in component ratio of film thickness of each layer in each position was calculated. Table 1 shows the maximum and minimum values of the deviation $\sigma_{j-m}$. The smaller the absolute value of the deviation $\sigma_{j-m}$, the flatter the distribution of thickness of each layer.

The results of Example 1 and Comparative Example 1 show that by changing, independently of the amount of Resin Solution 1 to be fed, the amount of the solvent to be added, the deviation in distribution of film thickness of each layer can be controlled with the average film thickness held constant. Further, the results of Example 1 and Comparative Example 1 show that although the solvent was poured only into the flow channel corresponding to the central layer, there is a change in deviation in component ratio of film thickness of each of the surface layers.

Examples 2 and 3 and Comparative Example 2

A film was formed with the same resin solutions by the same apparatus as in Example 1. Resin Solution 1 was introduced from the resin storage tank into the mixer at a speed of 5.2 kg/hr. A chemical curing agent obtained by mixing DMF, acetic anhydride, and isoquinoline together was introduced into Resin Solution 1 through another feed port of the mixer at 1.6 kg/hr. That is, 30 parts by weight of the chemical curing agent were introduced into 100 parts by weight of Resin Solution 1. The amounts of acetic anhydride and isoquinoline added at this time are as follows:

Acetic anhydride: 3.0 mol with respect to 1 mol of amic acid unit of Resin Solution 1

Isoquinoline: 0.3 mol with respect to 1 mol of amic acid unit of Resin Solution 1

DMF was added as a solvent to Resin Solution 1 through another feed port of the mixer in an amount shown in Table 1, with Resin Solution 1 and the chemical curing agent supplied in constant amounts. The solution mixed and diluted in the mixer was introduced into that flow channel of the three-layer coextrusion die which corresponds to a central layer. Meanwhile, DMF was added as a solvent to Resin Solution 2 obtained in Example of Synthesis 2, so that the solid content was adjusted to 14%. Resin Solution 2, whose solid content has been adjusted, was introduced at a speed of 1.0 kg/hr into those two flow channels of the three-layer coextrusion die which correspond respectively to two surface layers.

The multilayer liquid film extruded from the gap between the lips of the extrusion die was flow-cast onto a stainless-steel casting belt, and a film was formed while moving the stainless-steel casting belt. In each of Examples 2 and 3 and Comparative Example 2, the speed of movement of the casting belt, i.e., the speed of film formation was 1.34 m/min.

TABLE 1

| Example | Resin Solution 1 (Central Layer) | | | | Resin Solution 2 (Surface Layers 1 and 2) | |
|---|---|---|---|---|---|---|
| | Amount Fed kg/hr | Solid Content wt % | Solvent Added kg/hr (wt %) | Accelerator kg/hr (wt %) | Amount Fed kg/hr | Solid Content wt % |
| Example 1 | 5.2 | 15 | 2.60 (50) | | 1.00 | 15 |
| Comparative Example 1 | 6.5 | 15 | 1.95 (30) | | 1.25 | 15 |
| Example 2 | 5.2 | 15 | 1.04 (20) | 1.6 (30) | 1.0 | 14 |
| Example 3 | 5.2 | 15 | 0.52 (10) | 1.6 (30) | 1.0 | 14 |
| Comparative Example 2 | 5.2 | 15 | 0 (0) | 1.6 (30) | 1.0 | 14 |

| Example | Speed of Film Formation m/min | Position of Layer | Average Film Thickness μm | Maximum Value of $\sigma_{j-m}$ % | Minimum Value of $\sigma_{j-m}$ % |
|---|---|---|---|---|---|
| Example 1 | 1.34 | Surface Layer 1 | 2.0 | 9.4 | −9.5 |
| | | Central Layer | 10.0 | 2.6 | −2.8 |
| | | Surface Layer 2 | 2.0 | 5.0 | −3.8 |
| Comparative Example 1 | 1.68 | Surface Layer 1 | 2.0 | 15.5 | −9.5 |
| | | Central Layer | 10.0 | 5.0 | −6.1 |
| | | Surface Layer 2 | 2.0 | 11.0 | −12.4 |
| Example 2 | 1.34 | Surface Layer 1 | 2.0 | 2.2 | −1.9 |
| | | Central Layer | 10.0 | 1.1 | −0.6 |
| | | Surface Layer 2 | 2.0 | 1.9 | −3.0 |
| Example 3 | 1.34 | Surface Layer 1 | 2.0 | 5.5 | −5.0 |
| | | Central Layer | 10.0 | 2.3 | −2.6 |
| | | Surface Layer 2 | 2.0 | 6.4 | −5.5 |
| Comparative Example 2 | 1.34 | Surface Layer 1 | 2.0 | 13.5 | −9.9 |
| | | Central Layer | 10.0 | 3.5 | −5.8 |
| | | Surface Layer 2 | 2.0 | 14.4 | −10.2 |

After that, the multilayer liquid film was heated at 130° C. for 100 seconds, and thus transformed into a self-supporting multilayer gel film. Furthermore, the self-supporting multilayer gel film was peeled away from the casting belt, held on with a tenter clip, and then dried and imidized at 300° C. for 16 seconds, at 400° C. for 29 seconds, and then at 450° C. for 17 seconds. Thus obtained was a multilayer polyimide film, composed of a thermoplastic polyimide layer, a highly heat-resistant polyimide layer, and a thermoplastic polyimide layer, which has a width of approximately 50 cm.

The thickness of each of the layers of the multilayer polyimide film thus obtained was measured in the same manner as in Example 1 and Comparative Example 1. The results are shown in Table 1. The results of Examples 2 and 3 and Comparative Example 2 show that by changing, independently of the amounts of Resin Solution 1 and the chemical curing agent to be fed, the amount of the solvent to be added, the deviation in distribution of film thickness of each layer can be controlled with the average film thickness held constant. Further, the results of Examples 2 and 3 and Comparative Example 2 show that although the solvent was poured only into the flow channel corresponding to the central layer, there is a change in deviation in the component ratio of film thickness of each of the surface layers.

Examples 4 to 6 and Comparative Examples 3 and 4

A multilayer polyimide film (adhesive film) was manufactured with Resin Solutions 1 and 3 by the same apparatus as in Example 1. It should be noted that the temperatures of all the devices of FIG. 1 were adjusted to 0° C. Resin Solution 1 was caused to contain the following chemical dehydrating agent and catalyst:

Chemical dehydrating agent: 2.0 mol of acetic anhydride with respect to 1 mol of amic acid unit of Resin Solution 1

Catalyst: 0.5 mol of isoquinoline with respect to 1 mol of amic acid unit of Resin Solution 1

The viscosity of Resin Solution 1 was adjusted by introducing DMF into the mixer. Table 2 shows the viscosity thus adjusted. After that, a multilayer liquid film composed of Resin Solution 3, Resin Solution 1, and Resin Solution 3 was extruded from the three-layer coextrusion die onto an SUS endless belt moving at 15 mm below the die.

After that, the multilayer film was heated at 130° C. for 100 seconds, and thus transformed into a self-supporting gel film. Furthermore, the self-supporting gel film was peeled away from the endless belt, held on with a tenter clip, and then dried and imidized at 300° C. for 16 seconds, at 400° C. for 29 seconds, and then at 450° C. for 17 seconds. Thus obtained was a multilayer polyimide film, composed of an adhesive polyimide layer having a thickness of 2 μm, a highly heat-resistant polyimide layer having a thickness of 10 μm, and an adhesive polyimide layer having a thickness of 2 μm, which has a width of 510 mm.

On both sides of the multilayer polyimide film thus obtained, 12-μm-thick electrolytic copper foil (USLP-SE; manufactured by Nippon Denkai, Ltd.) was laminated. The laminate was sandwiched between two protection materials (APICAL 125NPI; manufactured by Kaneka Corporation). The laminate sandwiched between the protection materials was laminated with heat by a heat roller. Thus manufactured was a metal-clad laminate. The laminating temperature was 380° C. The laminating pressure was 196 N/cm (20 kgf/cm). The speed of lamination was 1.5 m/minute. The rate of dimensional change of the metal-clad laminate thus manufactured was measured. The rate of dimensional change was measured at seven pairs of measuring points as shown in FIG. 4. Table 2 shows the measurement results.

TABLE 2

| Example | Viscosity of Solution of Precursor Highly Heat-resistant Polyimide poise | Viscosity of Solution of Precursor Thermoplastic Polyimide poise | Average Rate of Dimensional Change % | Range of Deviation in Rate of Dimensional Change % |
|---|---|---|---|---|
| Example 4 | 300 | 400 | −0.03 | ±0.03 |
| Example 5 | 400 | 400 | −0.03 | ±0.01 |
| Example 6 | 500 | 400 | −0.03 | ±0.04 |
| Comparative Example 3 | 800 | 400 | −0.03 | ±0.08 |
| Comparative Example 4 | 1000 | 400 | −0.03 | ±0.08 |
| Example 7 | 400 | 350 | −0.03 | ±0.04 |
| Example 8 | 400 | 400 | −0.03 | ±0.01 |
| Comparative Example 5 | 400 | 440 | −0.03 | ±0.06 |
| Comparative Example 6 | 400 | 550 | −0.03 | ±0.09 |
| Comparative Example 7 | 400 | 620 | −0.03 | ±0.12 |

Examples 7 and 8 and Comparative Examples 5 to 7

A multilayer polyimide film and a metal-clad laminate were obtained in the same manner as in Examples 4 to 6 except that the viscosity of Resin Solution 1 was held at 400 poise and the viscosity of Resin Solution 3 was adjusted by changing the temperature of Resin Solution 3. Table 2 shows the viscosity thus adjusted. Thus obtained was a multilayer polyimide film, composed of an adhesive polyimide layer having a thickness of 2 μm, a highly heat-resistant polyimide layer having a thickness of 10 μm, and an adhesive polyimide layer having a thickness of 2 μm, which has a width of 510 mm.

The rate of dimensional change of a metal-clad laminate thus manufactured was measured. Table 2 shows the measurement results. Table 2 clearly shows that a distribution of film thickness in the film-width direction can be controlled by changing viscosity with solvent addition or temperature control.

Example 9

A three-layer polyimide film (adhesive film) was manufactured with Resin Solutions 1 and 4 by the apparatus of FIG. 1. The temperatures of all the devices of FIG. 1 were adjusted to 0° C. Raw material tanks were filled with Resin Solutions 1 and 4, respectively. Resin Solution 1 was introduced from the raw material tank into the mixer at a discharge rate of 5.2 kg/hr. A chemical curing agent prepared by mixing DMF, acetic anhydride, and isoquinoline with a ratio of 1 kg to 2.7 kg to 0.35 kg was introduced through another feed port of the mixer at a discharge rate of 1.6 kg/hr. Furthermore, Resin Solution 1 was diluted by introducing DMF through another feed port of the mixer at a discharge rate of 0.5 kg/hr. The solution thus mixed and diluted in the mixer was introduced into that flow channel of the multilayer coextrusion die (having a lip width of 650 mm and a lip gap of 1 mm) which corresponds to a central layer. Meanwhile, Resin Solution 4 was introduced at a discharge rate of 1 kg/hr into those two flow channels of the three-layer coextrusion die which correspond respectively to two surface layers. The liquid film extruded from the gap between the lips was flow-cast onto a stainless-steel endless belt.

Figure 5:
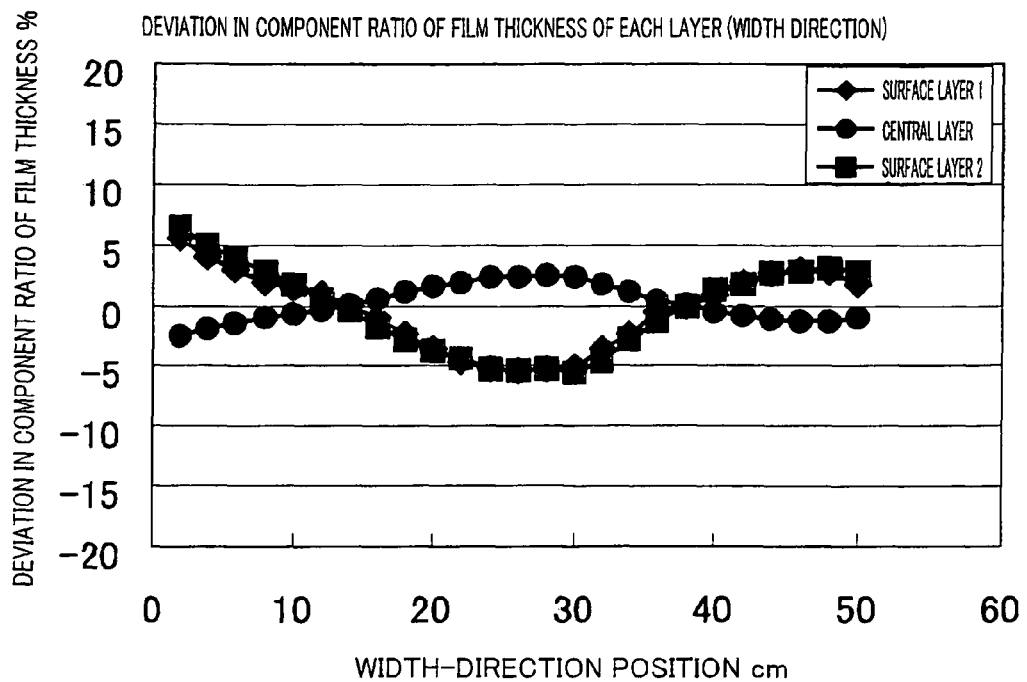
FIG. 5 is a graph showing a deviation in component ratio of film thickness of each layer in the film-width direction of a multilayer polyimide film obtained in Example 9.

The liquid film thus obtained was heated at 130° C. for 100 seconds, and thus transformed into a self-supporting gel film. The self-supporting gel film was peeled away from the endless belt, held on with a tenter clip, and then dried and imidized at 300° C. for 30 seconds, at 400° C. for 50 seconds, and then at 450° C. for 10 seconds. Thus obtained was a multilayer polyimide film composed of an adhesive polyimide layer having a thickness of 2 μm, a highly heat-resistant polyimide layer 10 μm, and an adhesive polyimide layer having a thickness of 2 μm. The film thickness of the obtained film in the width direction (500 mm) was measured with use of a noncontact multilayer film thickness meter. FIG. 5 shows the deviation in component ratio of film thickness of each layer in the film-width direction.

On both sides of the multilayer polyimide film thus obtained, 12-μm-thick electrolytic copper foil (USLP-SE; manufactured by Nippon Denkai, Ltd.) was laminated. The laminate was sandwiched between two protection materials (APICAL 125NPI; manufactured by Kaneka Corporation). The laminate sandwiched between the protection materials was laminated with heat by a heat roller. Thus manufactured was a metal-clad laminate. The laminating temperature was 380° C. The laminating pressure was 196 N/cm (20 kgf/cm). The speed of lamination was 1.5 m/minute. The rate of dimensional change of the metal-clad laminate thus obtained was measured. Table 3 shows the measurement results.

TABLE 3

| Example | Range of Deviation in Component Ratio of Film Thickness in Width Direction % | Range of Deviation in Rate of Dimensional Change in Width Direction % |
|---|---|---|
| Example 9 | ±6.4 | ±0.03 |
| Example 10 | ±2.2 | ±0.01 |
| Comparative Example 8 | ±14.4 | ±0.08 |

FIG. 5 and Table 3 show that a multilayer polyimide film whose deviation in component ratio of film thickness of each layer in the film-width direction is controlled within a range of not less than −10% to not more than 10% is obtained. Further, it is shown that the deviation in rate of dimensional change of the multilayer polyimide film thus obtained is controlled within a range of not less than −0.05% to not more than 0.05%.

Example 10

Figure 6:
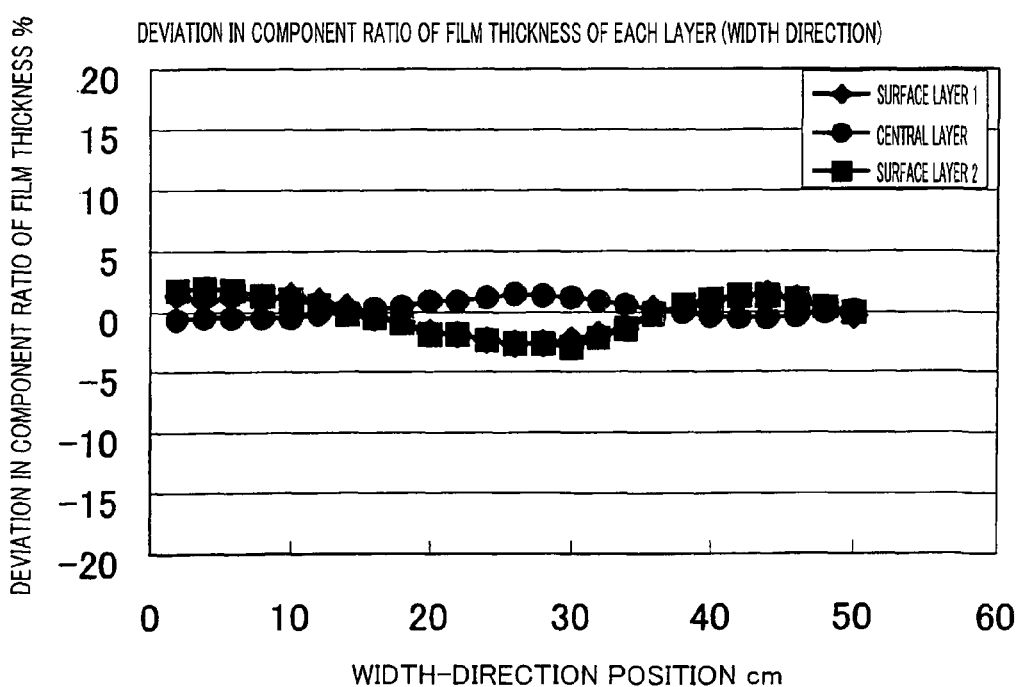
FIG. 6 is a graph showing a deviation in component ratio of film thickness of each layer in the film-width direction of a multilayer polyimide film obtained in Example 10.

A multilayer film having a width of 500 mm was manufactured under the same conditions as in Example 9 except that DMF was introduced into the mixer at a discharge rate of 1.0 kg/hr. The film thickness of the obtained film in the width direction was measured with use of a noncontact multilayer film thickness meter. FIG. 6 shows the deviation in component ratio of film thickness of each layer in the film-width direction. A metal-clad laminate was manufactured by performing heat-roller lamination under the same conditions as in Example 9. Table 3 shows the deviation in rate of dimensional change of the metal-clad laminate thus obtained. FIG. 6 and Table 3 show that a multilayer polyimide film whose deviation in component ratio of film thickness of each layer in the film-width direction is controlled within a range of not less than −5% to not more than 5% is obtained. Further, it is shown that the deviation in rate of dimensional change of the multilayer polyimide film thus obtained is controlled within a range of not less than −0.03% to not more than 0.03%.

Comparative Example 8

Figure 7:
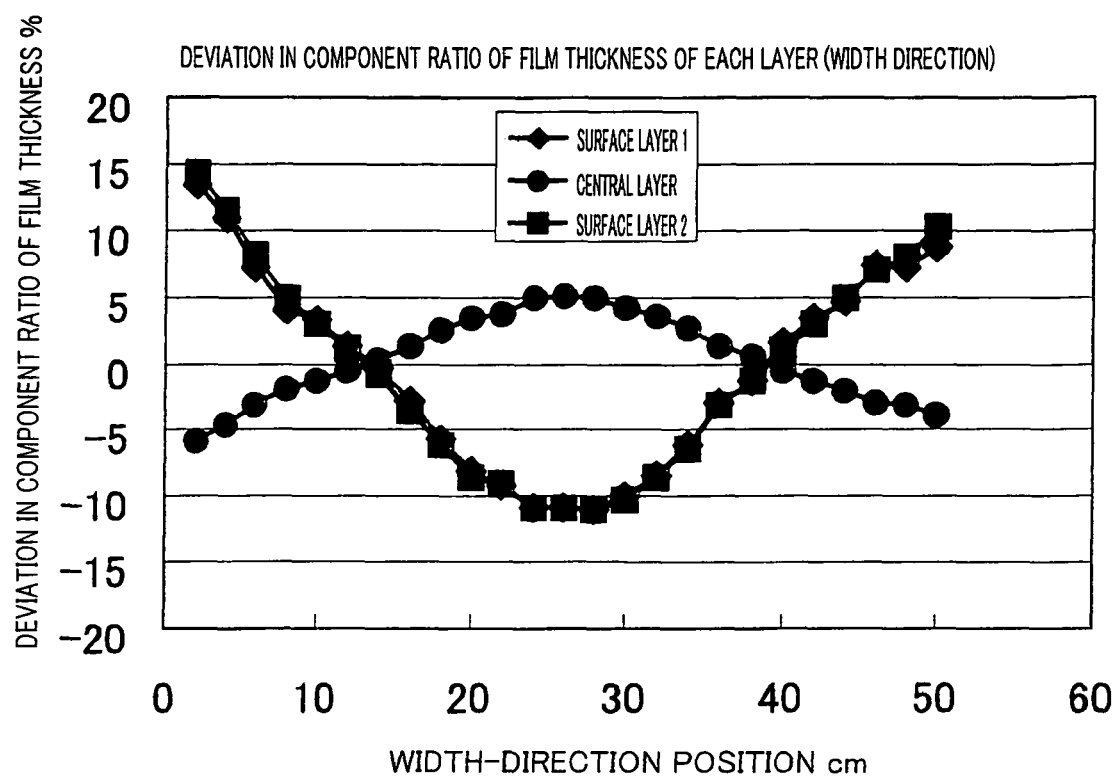
FIG. 7 is a graph showing a deviation in component ratio of film thickness of each layer in the film-width direction of a multilayer polyimide film obtained in Comparative Example 8.

A film-forming experiment was carried out under the same conditions as in Example 9 except that DMF was not introduced into the mixer. The film thickness of the obtained film in the width direction (500 mm) was measured with use of a noncontact multilayer film thickness meter. FIG. 7 shows the deviation in component ratio of film thickness of each layer in the film-width direction. A metal-clad laminate was manufactured by performing heat-roller lamination under the same conditions as in Example 9. Table 3 shows the deviation in rate of dimensional change of the metal-clad laminate thus obtained. FIG. 7 and Table 3 show that there exists a layer whose deviation in component ratio of film thickness in the film-width direction is greater than 10%. Further, it is shown that there are great variations in rate of dimensional change of the multilayer polyimide film thus obtained. Further, the metal-clad laminate thus obtained was found to have creases in it.

INDUSTRIAL APPLICABILITY

A multilayer polyimide film that is obtained by a method of the present invention is uniform in component ratio of film thickness of each layer in the width direction and small in fluctuation in properties in the film-width direction. This makes it possible to manufacture high-accuracy flexible printed-circuit boards, thereby allowing applications to the field of printed-circuit boards.

The invention claimed is:

1. A method for manufacturing a multilayer polyimide film in which a thickness of each layer is controlled, including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the method comprising the steps of:
   adding a solvent to the resin solutions to be fed into at least one of the flow channels; and
   adjusting, independently of amounts of the resin solutions to be fed, an amount of the solvent to be added.

2. The method as set forth in claim 1, wherein:
   the multilayer coextrusion die is a three-layer coextrusion die; and
   the solvent is added only to a resin solution to be fed into a flow channel corresponding to a central layer.

3. The method as set forth in claim 1, further comprising the step of adding, to the resin solutions to be fed into at least one of the flow channels, a solution containing a chemical dehydrating agent and an imidization catalyst.

4. The method as set forth in claim 3, wherein:
   the multilayer coextrusion die is a three-layer coextrusion die; and the solution containing the chemical dehydrating agent and the imidization catalyst is added only to a resin solution to be fed into a flow channel corresponding to a central layer.

5. The method as set forth in claim 3, further comprising the step of adjusting, independently of an amount of the solution, containing the chemical dehydrating agent and the imidization catalyst, to be added, the amount of the solvent to be added.

6. The method as set forth in claim 1, wherein:
one of the at least two types of polyimide resin solutions or polyimide precursor resin solutions is a non-thermoplastic polyimide solution or a precursor resin solution thereof; and
the other one of the at least two types of polyimide resin solutions or polyimide precursor resin solutions is a thermoplastic polyimide solution or a precursor resin solution thereof.

7. The method as set forth in claim 6, wherein:
the multilayer coextrusion die is a three-layer coextrusion die;
the non-thermoplastic polyimide solution or the precursor resin solution thereof is fed into a flow channel corresponding to a central layer; and
the thermoplastic polyimide solution or the precursor resin solution thereof is fed into two remaining flow channels.

8. A multilayer polyimide film, having at least two types of polyimide layers, which is obtained by a manufacturing method including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the method further including the steps of: adding a solvent to the resin solutions to be fed into at least one of the flow channels; and adjusting, independently of amounts of the resin solutions to be fed, an amount of the solvent to be added,
the multilayer polyimide film having layers each of whose deviations in component ratio of film thickness in a film-width direction falls within a range of not less than −10% to not more than 10%.

9. The multilayer polyimide film as set forth in claim 8, wherein the multilayer polyimide film is a multilayer film obtained by laminating, on at least one surface of a non-thermoplastic polyimide layer, an adhesive layer containing a thermoplastic polyimide.

10. The multilayer polyimide film as set forth in claim 8, wherein the deviation in component ratio of film thickness in the film-width direction falls within a range of not less than −5% to not more than 5%.

11. A multilayer polyimide film, having at least two types of polyimide layers, which is obtained by a manufacturing method including the steps of: preparing at least two types of polyimide resin solutions or polyimide precursor resin solutions; feeding the resin solutions to a multilayer coextrusion die via a plurality of flow channels, respectively; and width-spreading and flow-casting the resin solutions, the method further including the steps of: adding a solvent to the resin solutions to be fed into at least one of the flow channels; and adjusting, independently of amounts of the resin solutions to be fed, an amount of the solvent to be added,
the multilayer polyimide film having a deviation of not less than −0.05% to not more than 0.05% in rate of dimensional change in a film-width direction.

12. The multilayer polyimide film as set forth in claim 11, wherein the multilayer polyimide film is a multilayer film obtained by laminating, on at least one surface of a non-thermoplastic polyimide layer, an adhesive layer containing a thermoplastic polyimide.

13. The multilayer polyimide film as set forth in claim 11, wherein the deviation in rate of dimensional change in the film-width direction falls within a range of not less than −0.03% to not more than 0.03%.

* * * * *

UNITED STATES PATENT AND TRADEMARK OFFICE
CERTIFICATE OF CORRECTION

PATENT NO. : 8,124,241 B2
APPLICATION NO. : 12/224533
DATED : February 28, 2012
INVENTOR(S) : Yanagida et al.

Page 1 of 1

It is certified that error appears in the above-identified patent and that said Letters Patent is hereby corrected as shown below:

On the Title Page

Item (54) and Col. 1, line 2, Title

"POLYMIDE" should read -- POLYIMIDE --

Signed and Sealed this
Twenty-fourth Day of April, 2012

David J. Kappos
*Director of the United States Patent and Trademark Office*